US012787515B2

(12) United States Patent
Kim et al.

(10) Patent No.: US 12,787,515 B2
(45) Date of Patent: Nov. 3, 2026

(54) DISPLAY DEVICE

(71) Applicant: Samsung Display Co., LTD., Yongin-si (KR)

(72) Inventors: Hyun Hyang Kim, Suwon-si (KR); Jeong Weon Seo, Hwaseong-si (KR); Da Hye Kim, Seoul (KR); Man Soo Kim, Hwaseong-si (KR); Min Gwan Hyun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 605 days.

(21) Appl. No.: 18/160,228

(22) Filed: Jan. 26, 2023

(65) Prior Publication Data

US 2023/0317893 A1 Oct. 5, 2023

(30) Foreign Application Priority Data

Mar. 30, 2022 (KR) ........................ 10-2022-0039738

(51) Int. Cl.

| | |
|---|---|
| ***H10H 20/854*** | (2025.01) |
| ***H05K 1/189*** | (2026.01) |
| ***H10H 20/84*** | (2025.01) |
| ***H10H 20/851*** | (2025.01) |
| ***H10H 20/857*** | (2025.01) |
| ***H10H 20/858*** | (2025.01) |

(52) U.S. Cl.

CPC ........... *H10H 20/854* (2025.01); *H05K 1/189* (2013.01); *H10H 20/84* (2025.01); *H10H 20/8514* (2025.01); *H10H 20/857* (2025.01); *H10H 20/8581* (2025.01); *H05K 2201/10128* (2013.01)

(58) Field of Classification Search

CPC ........................... H10H 20/852; H10H 20/854

See application file for complete search history.

(56) References Cited

U.S. PATENT DOCUMENTS

| | | | | |
|---|---|---|---|---|
| 5,870,160 | A | 2/1999 | Yanagawa et al. | |
| 6,034,757 | A | 3/2000 | Yanagawa et al. | |
| 6,108,066 | A | 8/2000 | Yanagawa et al. | |
| 8,933,473 | B1 * | 1/2015 | Dubin | H01L 21/67236 257/79 |
| 10,388,703 | B2 * | 8/2019 | Park | H10K 59/873 |
| 2007/0230132 | A1 * | 10/2007 | Lee | H05K 7/20963 361/707 |

(Continued)

FOREIGN PATENT DOCUMENTS

| | | | |
|---|---|---|---|
| KR | 10-0409251 | B1 | 12/2003 |
| KR | 10-2012-0120279 | A | 11/2012 |

(Continued)

*Primary Examiner* — Monica D Harrison
*Assistant Examiner* — Jacob T Nelson
(74) *Attorney, Agent, or Firm* — Womble Bond Dickinson (US) LLP

(57) ABSTRACT

A display panel includes a light-emitting element on a top face of a substrate and an overcoat layer on the light-emitting element, a film member is on the overcoat layer of the display panel, a conductive layer is between the overcoat layer and the film member, a chassis member is on a bottom face of the substrate of the display panel, and a sealing member covers a side face of the display panel. The sealing member electrically connects the conductive layer and the chassis member to each other.

20 Claims, 16 Drawing Sheets

(56) References Cited

U.S. PATENT DOCUMENTS

| | | | | |
|---|---|---|---|---|
| 2015/0226997 | A1* | 8/2015 | Tomomasa | G02F 1/133308 |
| | | | | 348/794 |
| 2022/0009213 | A1* | 1/2022 | Park | H10K 59/873 |
| 2022/0208952 | A1* | 6/2022 | Shin | H10K 59/131 |

FOREIGN PATENT DOCUMENTS

| | | | | | |
|---|---|---|---|---|---|
| KR | 20140095863 | A | * | 8/2014 | G02B 1/10 |
| KR | 10-2018-0061711 | A | | 6/2018 | |

* cited by examiner

DISPLAY DEVICE

CROSS-REFERENCE TO RELATED APPLICATION

This application claims priority to and the benefit of Korean Patent Application No. 10-2022-0039738, filed on Mar. 30, 2022, in the Korean Intellectual Property Office, the content of which is incorporated herein in its entirely by reference.

BACKGROUND

1. Field

Aspects of embodiments of the present disclosure relate to a display device.

2. Description of Related Art

Display devices are under increasing development as the importance of multimedia increase. Various types of display devices, such as an organic light-emitting diode (OLED) display device and a liquid crystal display device (LCD), are being used.

A device that displays an image includes a display panel, such as an organic light-emitting display panel or a liquid crystal display panel. The light-emitting display panel may include a light-emitting element. For example, when a light-emitting diode (LED) is the light-emitting element, it may be an organic light-emitting diode (OLED) using an organic material as a fluorescent material and/or an inorganic light-emitting diode using an inorganic material as a fluorescent material.

The inorganic light-emitting diode using an inorganic semiconductor as the fluorescent material is durable even under a high-temperature environment and has higher blue light efficiency compared to the organic light-emitting diode. However, a manufacturing process of the inorganic light-emitting diode element is complicated. Recently, a transfer scheme using dielectrophoresis (DEP) has been developed to manufacture the inorganic light-emitting diode element. Research on the inorganic light-emitting diode having superior durability and efficiency compared to the organic light-emitting diode is continuing.

SUMMARY

Embodiments of the present disclosure provide a display device capable of discharging static electricity that may be generated on a display surface.

Aspects and features of the present disclosure are not limited to the above-mentioned aspects and features. Other aspects and features according to the present disclosure that are not mentioned may be understood based on following description and may be more clearly understood based on embodiments according to the present disclosure. Further, it will be easily understood that aspects and features according to the present disclosure may be realized as shown in the claims and from combinations thereof.

According to an embodiment of the present disclosure, a display device includes: a display panel including a light-emitting element on a top face of a substrate and an overcoat layer on the light-emitting element; a film member on the overcoat layer of the display panel; a conductive layer between the overcoat layer and the film member; a chassis member on a bottom face of the substrate of the display panel; and a sealing member covering a side face of the display panel. The sealing member electrically connects the conductive layer and the chassis member to each other.

The sealing member may include a conductive material, and the chassis member may include a conductive metal material.

A width of the film member may be greater than each of a width of the display panel and a width of the chassis member, and the width of the chassis member may be larger than the width of the display panel.

The chassis member and the film member may be spaced apart from each other with the display panel therebetween, and the sealing member may be in a space between the film member and the chassis member.

A bottom face of the conductive layer may be in direct contact with the sealing member, and a top face of the chassis member may be in direct contact with the sealing member.

The display device may further include an adhesive layer between the conductive layer and the overcoat layer bonding the conductive layer and the overcoat layer to each other. The adhesive layer may expose a portion of the conductive layer, and the sealing member may be in direct contact with the portion of the conductive layer exposed through the adhesive layer.

The conductive layer may cover an entire of a bottom face of the film member and may include a transparent metal oxide.

The display device may further include a wavelength conversion layer between the overcoat layer and the light-emitting element and a color filter layer between the wavelength conversion layer and the overcoat layer.

The display device may further include a heat dissipation portion between the chassis member and the substrate.

The heat dissipation portion may include graphite.

The film member may include a base film and an anti-fingerprint film on the base film.

The base film may include cellulose triacetate.

According to another embodiment of the present disclosure, a display device has a display area and a non-display area extending around a periphery of the display area and includes: a display panel defining the display area; a film member on a top face of the display panel and having a width greater than a width of the display panel; a conductive layer between the display panel and the film member and having a larger width than the width of the display panel; a chassis member on a bottom face of the display panel. a width of the chassis member being larger than the width of the display panel and is smaller than the width of the film member; and a sealing member covering a side face of the display panel. The chassis member and the film member are spaced apart from each other in the non-display area, and the sealing member is between the chassis member and the film member and directly contacts a top face of the chassis member.

The chassis member may include a conductive metal, the sealing member may include a conductive material, and the sealing member may be in direct contact with a bottom face of the conductive layer.

The display panel may include a substrate, a light-emitting element on the substrate, and a heat dissipation portion between the chassis member and the substrate.

The display device may further include a plurality of flexible printed circuit boards on the substrate of the display panel. One side of each of the plurality of flexible printed circuit boards may be on a top face of the substrate, and another side of each of the plurality of flexible printed circuit board may be on a bottom face of the chassis member.

A resin may be between each of the flexible printed circuit boards and the substrate.

The chassis member may have an opening extending through the chassis member, and the sealing member may be in and may extend through the opening in the chassis member.

The sealing member may extend through the opening and may cover a portion of a bottom face of the chassis member.

The chassis member may have a plurality of grooves and a plurality of protrusions protruding outwardly from the chassis member. The grooves and the protrusions may be alternately arranged with each other, and the sealing member may be in each of the plurality of grooves and may be coupled to a side face of each groove of the chassis member.

The display device, according to embodiments of the present disclosure, may discharge static electricity that may be generated on a display surface.

Aspects and features of the present disclosure are not limited to those mentioned above, and other aspects and features not expressly mentioned herein will be clearly understood by those skilled in the art from following descriptions.

BRIEF DESCRIPTION OF DRAWINGS

The above and other aspects and features of the present disclosure will become more apparent by describing, in detail, embodiments thereof with reference to the attached drawings, in which.

DETAILED DESCRIPTION

Figure 1:
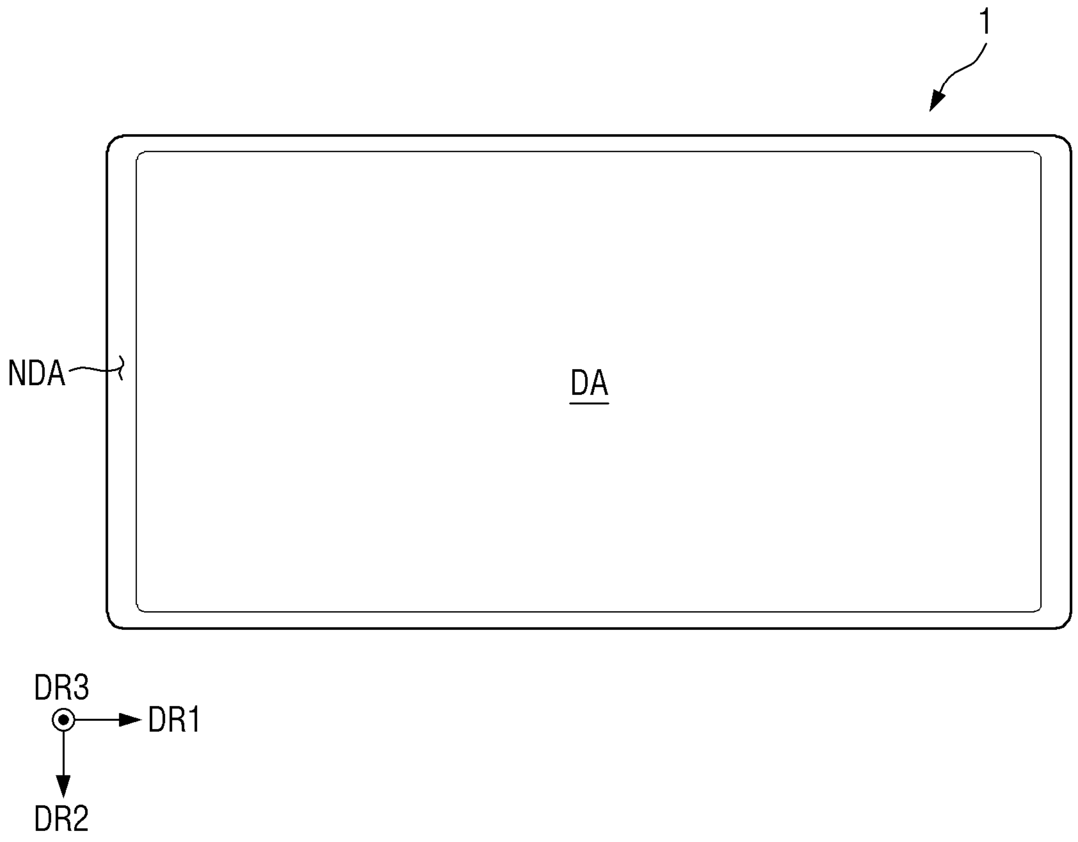
FIG. 1 is a plan view showing a display device according to an embodiment.

The present disclosure will now be described more fully hereinafter with reference to the accompanying drawings, in which embodiments thereof are shown. The present disclosure may, however, be embodied in different forms and should not be construed as limited to the embodiments set forth herein. Rather, these embodiments are provided so that this disclosure will be thorough and complete and will filly convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Aspects and features of each of various embodiments of the present disclosure may be partially or entirely combined with each other and may technically variously interwork with each other, and respective embodiments may be implemented independently of each other or may be implemented together in association with each other.

Hereinafter, embodiments of the present disclosure will be described with reference to the accompanying drawings.

FIG. 1 is a plan view showing a display device according to an embodiment.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. The first direction DR1 refers to a horizontal direction in the drawing, the second direction DR2 refers to a vertical direction in the drawing, and the third direction DR3 may refer to a direction toward a top or a bottom (e.g., out of or into the page) in the drawing. As used herein, unless otherwise specified, a "direction" may refer to both opposite directions toward both opposite sides in the direction. Further, when distinguishing both opposite directions toward both opposite sides in the direction from each other, one side may be referred to as "one side in the direction" and the other side (or the opposite side) may be referred to as "the other side in the direction". Based on FIG. 1, a side to which an arrow is directed is referred to as one side, and the opposite side thereto is referred to as the other side.

Hereinafter, for convenience of description, in referring to faces of a display device 1 or members constituting the display device 1, one face facing in a direction in which an image is displayed is referred to as a top face, and the opposite face to one face is referred to as a bottom face. However, the present disclosure is not limited thereto. One face and the other face of each of the members may be referred to as a front face and a rear face, respectively, or may be referred to as a first face and a second face, respectively.

Referring to FIG. 1, the display device 1 displays a moving image or a still image. The display device 1 may refer to any electronic device that provides (or includes) a display screen. For example, the display device 1 may be a television, a laptop, a monitors, a billboard, an Internet of Thing (IoT) device, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. that may provide a display screen.

The display device 1 includes a display panel (see, e.g., 300 in FIG. 2) that provides a display screen. Examples of the display panel may include an inorganic light-emitting diode display panel, an organic light-emitting display panel, a quantum dot light-emitting display panel, a plasma display panel, and a field emission display panel. Hereinafter, an embodiment in which the display device 1 includes the inorganic light-emitting diode display panel as the display panel 300 will be described. However, the present disclosure is not limited thereto. When the same technical idea is applicable to other display panels, the present disclosure may also be applied to the other display panels.

A shape of the display device 1 may be variously modified. For example, the display device 1 may have a rectangular shape with a long-side extending in the first direction DR1 and a short-side extending in the second direction DR2 in a plan view. In another example, the display device 1 may have a rectangular shape with a long-side extending in the second direction DR2 and a short-side extending in the first direction DR1 in a plan view. However, the present disclosure is not limited thereto. The display device 1 may have a shape, such as a square, a rectangle with rounded corners, other polygons, or a circle. Further, a shape of a display area DA of the display device 1 may be similar to an overall shape of the display device 1. In FIG. 1, the display device 1 and the display area DA are each illustrated as having a rectangular shape with a long-side extending in the first direction DR1 and a short-side extending in the second direction DR2.

The display device 1 may have the display area DA and a non-display area NDA. The display area DA refers to an area where an image may be displayed, while the non-display area NDA refers to an area where the image is not displayed. The display area DA may be referred to as an active area, and the non-display area NDA may be referred to as a non-active area. The display area DA may occupy, generally, an inner region of the display device 1. However, the present disclosure is not limited thereto.

The non-display area NDA may be disposed around (e.g., may extend around) the display area DA. The non-display area NDA may completely or partially surround (e.g., surround in a plan view or extend around a periphery of) the display area DA. The display area DA may have a rectangular shape, while each non-display area NDA may be disposed adjacent to each of four sides of the display area DA. However, the present disclosure is not limited thereto. The non-display area NDA may constitute a bezel of the display device 1. Lines or circuit drivers included in the display device 1 may be disposed in each non-display area NDA. External devices may be mounted in the non-display area NDA.

The display area DA and the non-display area NDA of the display device 1 may also be applied to each of the components included in the display device 1. Hereinafter, components included in the display device 1 will be described.

Figure 2:
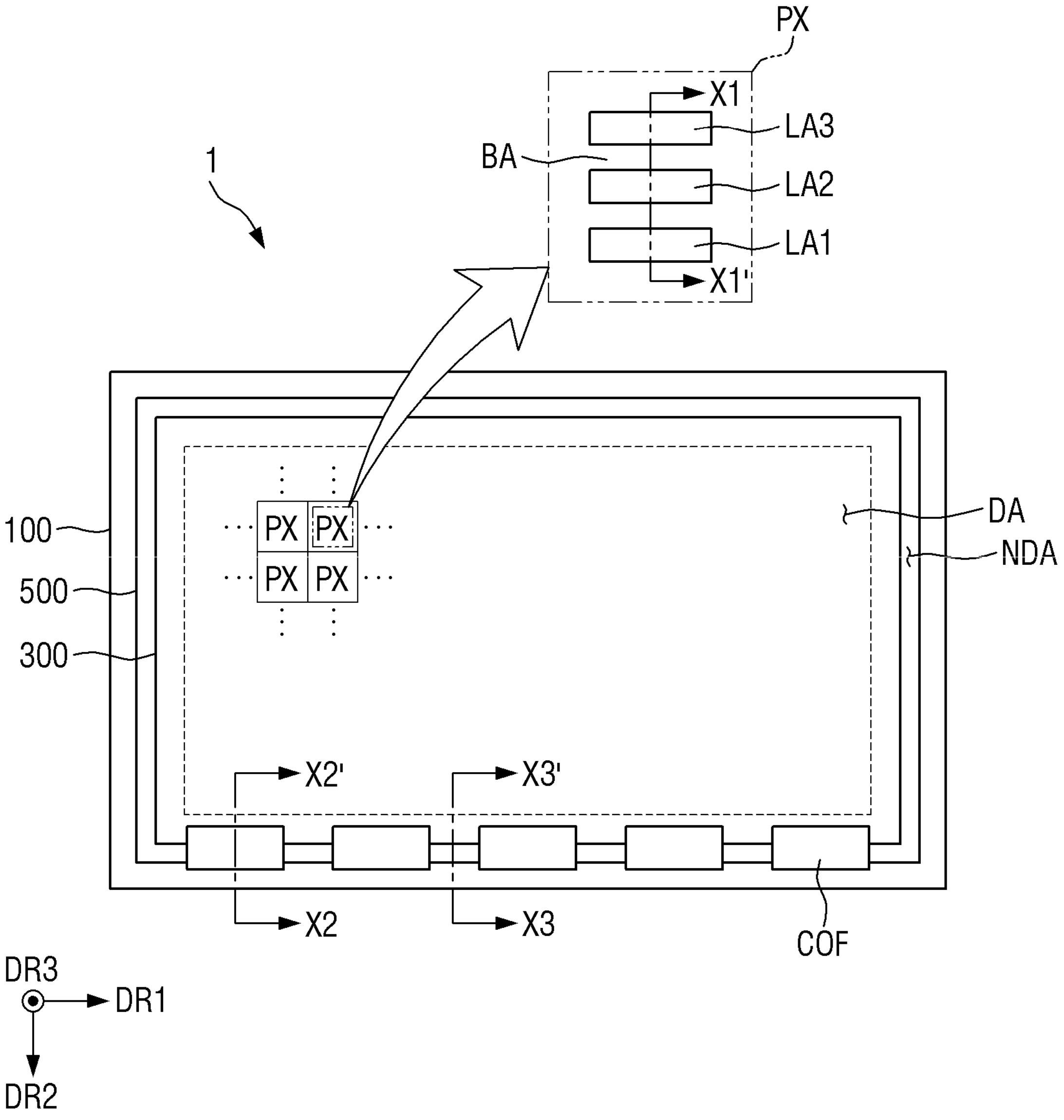
FIG. 2 is a plan view schematically showing a film member, a display panel, and a chassis member of the display device shown in FIG. 1.

FIG. 2 is a plan view schematically showing a film member, a display panel, and a chassis member included in the display device 1 shown in FIG. 1.

Referring to FIG. 2, the display device 1 may include a film member 100, the display panel 300, and a chassis member 500. Although a stack structure is not shown in FIG. 2, the display device 1 may include a stack structure in the third direction DR3 of the chassis member 500, the display panel 300, and the film member 100. in this order. For convenience of description, descriptions of the film member 100, the display panel 300, and the chassis member 500 will be made in this order.

The film member 100 may protect the display device 1 from an outside (e.g., an outside environment). The film member 100 may constitute a top of the display device 1 and may protect the display panel 300 disposed under the film member 100. For example, the film member 100 may be disposed on a top face of the display panel 300.

An area of the film member 100 may be larger than an area of the display panel 300 and may be larger than an area of the chassis member 500. For example, the film member 100 may entirely cover each of the display panel 300 and the chassis member 500 and may extend beyond each of the display panel 300 and the chassis member 500. A detailed description of a structure of the film member 100 will be made later.

The display panel 300 may display an image. The display panel 300 may define the display area DA of the display device 1. The display area DA of the display panel 300 may include a plurality of pixels PX. The plurality of pixels PX may be arranged in a matrix arrangement. Each pixel PX may have a rectangle or a square shape in a plan view. However, the present disclosure is not limited thereto. In some embodiments, each pixel PX may have a rhombus shape in which each side is inclined relative to one direction.

Each of the plurality of pixels PX may include a plurality of light-emitting areas emitting light in a specific wavelength band. For example, the pixel PX may include a first light-emitting area LA1, a second light-emitting area LA2, and a third light-emitting area LA3. The first light-emitting area LA1 may emit light of a first color, the second light-emitting area LA2 may emit light of a second color, and the third light-emitting area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm. However, the present disclosure is not limited thereto.

Each of the plurality of pixels PX of the display area DA of the display panel 300 may include a light-blocking area BA positioned between adjacent ones of the plurality of light-emitting areas LA1, LA2, and LA3. For example, the light-blocking area BA may be disposed between the first light-emitting area LA1 and the second light-emitting area LA2 and between the second light-emitting area LA2 and the third light-emitting area LA3.

A detailed description of a structure of the display panel 300 will be made later.

The chassis member 500 supports a bottom face of the display panel 300 and, thus, may improve mechanical strength of the display device 1. The chassis member 500 may be disposed on the bottom face of the display panel 300. The chassis member 500 may be made of a rigid material to ensure its mechanical strength, and may include, for example, a metal, such as SUS 304 (e.g., 304 stainless steel) or aluminum.

A flexible printed circuit board COF may be disposed at one side of the display panel 300 and may supply driving signals to the pixels PX of the display panel 300. A plurality of flexible printed circuit boards COF may be arranged to be spaced apart from each other. Although electrical connection between the pixel PX and the flexible printed circuit board COF is not shown, the flexible printed circuit board COF may be electrically connected to the pixel PX of the display panel 300. The flexible printed circuit board COF may extend from one side of the display panel 300 to the chassis member 500 and may be attached to a bottom face of the chassis member 500 as described later (see, e.g., FIG. 6).

Hereinafter, a structure of each of the members constituting the display device 1 will be described.

Figure 3:
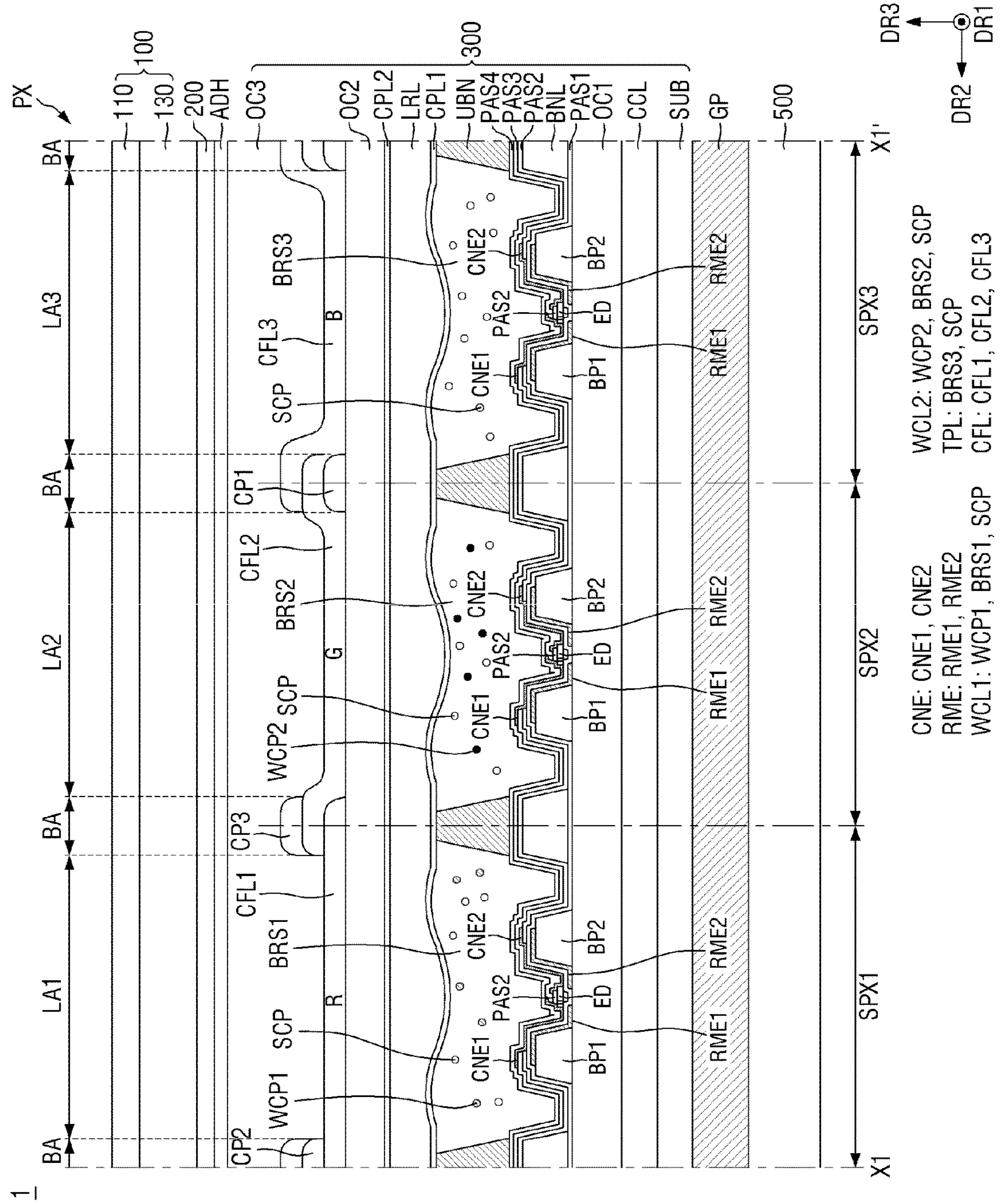
FIG. 3 is a cross-sectional view schematically showing a cross section taken along the line X1-X1' in FIG. 2.
Figure 4:
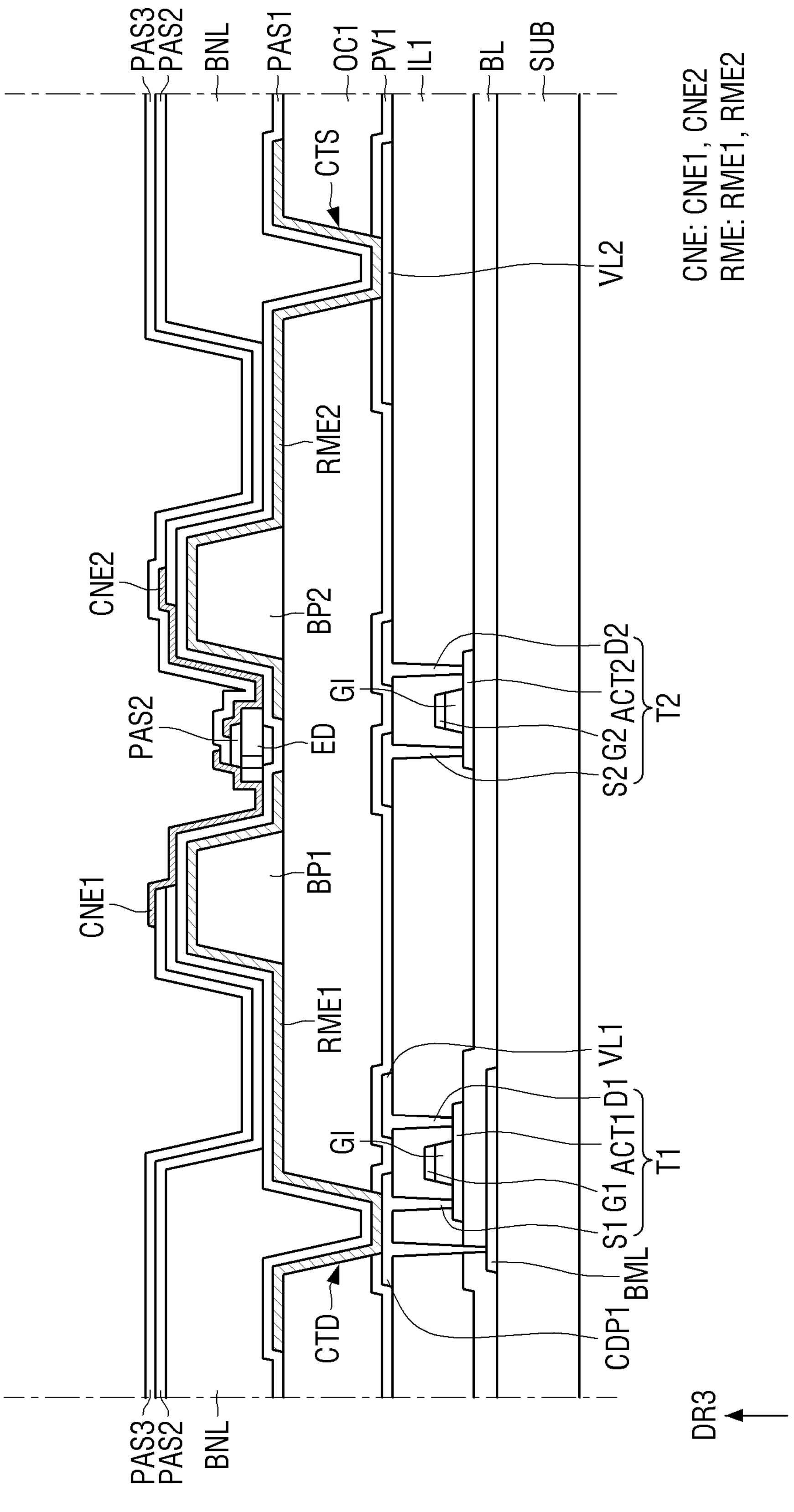
FIG. 4 is a structural diagram schematically showing a connection relationship between a light-emitting element and a circuit layer shown in FIG. 3.
Figure 5:
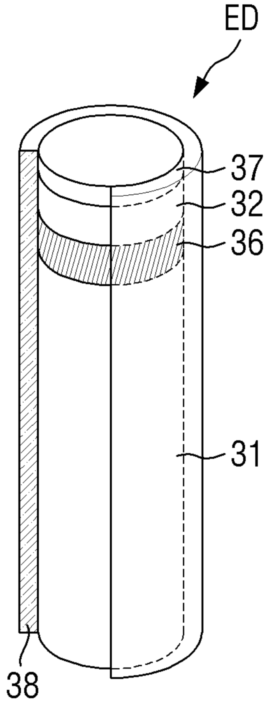
FIG. 5 schematically shows a light-emitting element.

FIG. 3 is a cross-sectional view schematically showing a cross section taken along the line X1-X1' in FIG. 2, FIG. 4 is a structural diagram schematically showing a connection relationship between a light-emitting element and a circuit layer shown in FIG. 3, and FIG. 5 schematically shows a light-emitting element.

Referring to FIG. 3, each of the pixels PX of the display device 1 may include a plurality of sub-pixels SPXn. For example, one pixel PX may include a first sub-pixel SPX1, a second sub-pixel SPX2, and a third sub-pixel SPX3. The first sub-pixel SPX1 may emit light of the first color, the second sub-pixel SPX2 may emit light of the second color, and the third sub-pixel SPX3 may emit light of the third color. For example, the first color light may be red light having a peak wavelength in a range of about 610 nm to about 650 nm, the second color light may be green light having a peak wavelength in in a range of about 510 nm to about 550 nm, and the third color light may be blue light having a peak wavelength in a range of about 440 nm to about 480 nm. However, the present disclosure is not limited thereto. The sub-pixels SPXn may emit light of the same color. In an embodiment, the sub-pixels SPXn may emit blue light. Although it is shown in FIG. 3 that one pixel PX includes three sub-pixels SPXn, the present disclosure is not limited thereto. For example, one pixel PX may include a greater number of sub-pixels SPXn.

Each of the sub-pixels SPXn of the display device 1 may include a light-emitting area and a non-light-emitting area. The light-emitting area may be an area in which a light-emitting element ED is disposed to emit light in a specific wavelength band. The non-light-emitting area may be an area in which the light-emitting element ED is not disposed and where light emitted from the light-emitting element ED does not reach and, thus, from which light is not emitted.

The light-emitting area may include an area in which the light-emitting element ED is disposed and an area adjacent to the light-emitting element ED toward which light emitted from the light-emitting element ED is emitted. For example, the light-emitting area may include an area toward which the light emitted from the light-emitting element ED is reflected from or refracted by other members and then is directed (e.g., directed toward a user). A plurality of light-emitting elements ED is disposed in each sub-pixel SPXn. An area in which the light-emitting elements ED are disposed and an area adjacent thereto may constitute the light-emitting area.

In FIGS. 2 and 3, it is illustrated that the light-emitting areas of each sub-pixel SPXn have a uniform area size. However, the present disclosure is not limited thereto. In some embodiments, the light-emitting areas of each sub-pixel SPXn may have different area sizes based on a color or a wavelength band of light emitted from the light-emitting element ED disposed in the sub-pixel. Hereinafter, for convenience of description, a structure of the display panel 300 will be described first.

With reference to FIG. 4 and FIG. 5 in conjunction with FIG. 3, the display panel 300 may include a substrate SUB, a circuit layer CCL, a first overcoat layer OC1, a bank pattern BP1 and BP2, a first insulating layer PAS1, a plurality of electrodes RME, a bank layer BNL, a second insulating layer PAS2, a light-emitting element ED, a connection electrode CNE, a third insulating layer PAS3, a fourth insulating layer PAS4, an upper bank layer UBN, a color control structure WCL1, WCL2, and TPL, a first capping layer CPL1, a low refractive index layer LRL, a second capping layer CPL2, a second overcoat layer OC2, a color filter layer CFL, and a third overcoat layer OC3.

The substrate SUB may be a base of the display panel 300. The substrate SUB may be made of an insulating material, such as glass, quartz, or a polymer resin. The substrate SUB may be a rigid substrate SUB or a flexible substrate SUB capable of being bent, folded, and rolled. A bottom face of the substrate SUB may be a bottom face of the display panel 300.

The circuit layer CCL may be disposed on the substrate SUB. Several lines that transmit electrical signals to a light-emitting element disposed on the substrate SUB may be disposed in the circuit layer CCL. As shown in FIG. 4, the circuit layer CCL may include a plurality of conductive layers including a first conductive layer, a semiconductor layer, a second conductive layer, and a third conductive layer, and a plurality of insulating layers including a buffer layer BL, a first gate insulating layer GI, a first interlayer insulating layer IL1, and a first protective layer PVL.

The first conductive layer may be disposed on the substrate SUB. The first conductive layer includes a lower metal layer BML, and the lower metal layer BML is disposed to overlap a first active layer ACT1 of a first transistor T1. The lower metal layer BML may prevent light from being incident on the first active layer ACT1 of the first transistor or may be electrically connected to the first active layer ACT1 of the first transistor T1 to stabilize electrical characteristics of the first transistor T1. However, in some embodiments, the lower metal layer BML may be omitted.

The buffer layer BL may be disposed on the lower metal layer BML and the substrate SUB. The buffer layer BL may be formed on the substrate SUB to protect transistors of the pixel PX from moisture penetrating through the substrate SUB, which is vulnerable to moisture permeation, and may provide a planar surface.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may be respectively disposed to partially overlap a first gate electrode G1 and a second gate electrode G2 of the second conductive layer, which will be described later.

The semiconductor layer may include polycrystalline silicon, single crystal silicon, oxide semiconductor, and the like. In another embodiment, the semiconductor layer may include polycrystalline silicon. The oxide semiconductor may be an oxide semiconductor including indium (In). For example, the oxide semiconductor may include at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), and Indium Gallium Zinc Tin Oxide (IGZTO).

Although the drawing illustrates that the sub-pixel SPXn includes the first transistor T1 and the second transistor T2, the present disclosure is not limited thereto. The display device 1 (and/or the sub-pixel SPXn) may include a greater number of transistors.

The first gate insulating layer GI is disposed on the semiconductor layer and in the display area DA. The first gate insulating layer GI may be a gate insulating film of each of the transistors T1 and T2. The drawing illustrates that the first gate insulating layer GI together with the gate electrodes G1 and G2 of the second conductive layer, to be described later, are patterned such that the first gate insulating layer GI is partially disposed between the second conductive layer and each of the active layers ACT1 and ACT2 of the semiconductor layer. However, the present disclosure is not limited thereto. In some embodiments, the first gate insulating layer GI may be disposed on an entirety of the buffer layer BL.

The second conductive layer is disposed on the first gate insulating layer GI. The second conductive layer may include the first gate electrode G1 of the first transistor T1 and the second gate electrode G2 of the second transistor T2. The first gate electrode G1 may be disposed to overlap a channel area of the first active layer ACT1 in the third direction DR3 (e.g., a thickness direction of the display device 1). The second gate electrode G2 may be disposed to overlap a channel area of the second active layer ACT2 in the third direction DR3 (e.g., the thickness direction).

The first interlayer insulating layer IL1 is disposed on the second conductive layer. The first interlayer insulating layer IL1 may be an insulating film between the second conductive layer and other layers disposed thereon and may protect the second conductive layer.

The third conductive layer is disposed on the first interlayer insulating layer IL1. The third conductive layer may include a first voltage line VL1 and a second voltage line VL2 disposed in the display area DA and a first conductive pattern CDP1, and each of source electrodes S1 and S2 and each of drain electrodes D1 and D2 of each of the transistors T1 and T2.

The first voltage line VL1 may receive a high-potential voltage (e.g., a first power voltage) to be delivered to a first electrode RME1. A low-potential voltage (e.g., a second power voltage) to be transmitted to a second electrode RME2 may be applied to the second voltage line VL2. The first voltage line VL1 may contact the first active layer ACT of the first transistor T1 via a contact hole (e.g., a contact opening) extending through the first interlayer insulating layer IL1. The first voltage line VL1 may be the first drain electrode D1 of the first transistor T1. The second voltage line VL2 may be directly connected to the second electrode RME2, which will be described later.

The first conductive pattern CDP1 may contact the first active layer ACT1 of the first transistor T1 via a contact hole (e.g., a contact opening) extending through the first interlayer insulating layer IL1. The first conductive pattern CDP1 may contact the lower metal layer BML via another contact hole (e.g., another contact opening) extending through the first interlayer insulating layer IL1 and the buffer layer BL. The first conductive pattern CDP1 may be the first source electrode S1 of the first transistor T1. Further, the first conductive pattern CDP1 may be connected to the first electrode RME1 or a first connection electrode CNE1, to be described later. The first transistor T1 may transmit the first power voltage applied from the first voltage line VL1 to the first electrode RME1 or the first connection electrode CNE1.

Each of the second source electrode S2 and the second drain electrode D2 may contact the second active layer ACT2 of the second transistor T2 via a contact hole (e.g., a contact opening) extending through the first interlayer insulating layer I1.

The first protective layer PV1 is disposed on the third conductive layer. The first protective layer PV1 is an insulating film between the third conductive layer and other layers thereon and protects the third conductive layer.

Each of the buffer layer BL, the first gate insulating layer GI, the first interlayer insulating layer IL1, and the first protective layer PV1 as described above may include a plurality of inorganic layers alternately stacked with each other. For example, each of the buffer layer BL, the first gate insulating layer GI, the first interlayer insulating layer IL1, and the first protective layer PV1 may be embodied as a stack of two inorganic layers including at least one of silicon oxide ($SiO_x$), silicon nitride ($SiN_x$), or silicon oxynitride ($SiO_xN_y$) or may be embodied as a stack in which a plurality of inorganic layers including at least one of silicon oxide ($SiO_x$), silicon nitride ($SiN_x$), or silicon oxynitride ($SiO_xN_y$) are alternately stacked.

The first overcoat layer OC1 may be disposed on the circuit layer CCL. In one embodiment, the first overcoat layer OC1 may be disposed on the first protective layer PV1 of the circuit layer CCL. The first overcoat layer OC1 may include an organic insulating material, for example, an organic insulating material, such as polyimide (PI), and may remove (or planarize) a step caused by various lines in the circuit layer CCL so that a top surface thereof may be planar. However, in some embodiments, the first overcoat layer OC1 may be omitted.

A plurality of bank patterns BP1 and BP2 may be disposed on the first overcoat layer OC1. For example, the bank patterns BP1 and BP2 may be directly disposed on the first overcoat layer OC1. Each of the bank patterns BP1 and BP2 may have a structure in which at least a portion thereof protrudes from a top face of the first overcoat layer OC1. The protruding portion of each of the bank patterns BP1 and BP2 may have a side face that is inclined or curved (e.g., curved having a certain curvature). Thus, light emitted from the light-emitting element ED may be reflected from the electrode RME disposed on the bank patterns BP1 and BP2 and travel upwardly away from the overcoat layer OC1. Each of the bank patterns BP1 and BP2 may include, but is not limited to, an organic insulating material, such as polyimide (PI).

Each of a plurality of electrodes RME (e.g., RME1 and RME2) may be disposed on each of the bank patterns BP1 and BP2 and the first overcoat layer OC1. For example, at least a portion of each of the first electrode RME1 and the second electrode RME2 may be disposed on the inclined side face of the bank pattern BP1 and BP2, respectively. A width measured in the second direction DR2 of each of the plurality of electrodes RME may be smaller than a width measured in the second direction DR2 of each of the bank patterns BP1 and BP2. A spacing between the first electrode RME1 and the second electrode RME2 in the second direction DR2 may be smaller than a spacing between the bank patterns BP1 and BP2 in the second direction DR2. At least portions of the first electrode RME1 and the second electrode RME2 may be directly disposed on the first overcoat layer OC1 and, thus, may be disposed in the same plane.

The light-emitting element ED disposed between the bank patterns BP1 and BP2 may emit light toward both opposite ends which may be directed to the electrodes RME, respectively disposed on the bank patterns BP1 and BP2.

The light-emitting element ED may be embodied as a light-emitting diode. In some embodiments, the light-emitting element ED may be embodied as an inorganic light-emitting diode made of an inorganic material and having a nano-meter to micro-meter size. The light-emitting elements ED may be arranged between the two electrodes facing toward each other. When an electric field in a specific direction is generated between the two electrodes, the light-emitting elements ED may be aligned in the same orientation.

The light-emitting element ED according to one embodiment may have a shape extending in (e.g., primarily extending in) one direction. The light-emitting element ED may have a shape, such as a cylinder, a rod, a wire, or a tube. However, the shape of the light-emitting element ED according to the present disclosure is not limited thereto. The light-emitting element ED may have a variety of shapes. In another embodiment, the light-emitting element ED may have a shape of a polygonal prism, such as a cube, a cuboid, or a hexagonal prism. In other embodiments, the light-emitting element may extend in one direction and may have a partially inclined outer face.

The light-emitting element ED may include a semiconductor layer doped with any conductive type, for example, p-type or n-type, impurities. The semiconductor layer may receive an electrical signal applied from an external power source and may emit light of a specific wavelength band. The light-emitting element ED may include a first semiconductor layer 31, a second semiconductor layer 32, a light-emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be made of at least one of AlGaInN, GaN, AlGaN, InGaN, AlN, and InN and may be doped with a n-type dopant. The n-type dopant doped into the first semiconductor layer 31 may be Si, Ge, Sn, or the like.

The second semiconductor layer 32 may be disposed on the first semiconductor layer 31 with the light-emitting layer 36 interposed therebetween. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be made of at least one of AlGaInN, GaN, AlGaN, InGaN, AlN, and InN and may be doped with a p-type dopant. The p-type dopant doped into the second semiconductor layer 32 may be Mg, Zn, Ca, Se, Ba, or the like.

In one embodiment, each of the first semiconductor layer 31 and the second semiconductor layer 32 is composed of a single layer. However, the present disclosure is not limited thereto. Depending on a material of the light-emitting layer 36, each of the first semiconductor layer 31 and the second semiconductor layer 32 may include a greater number of layers, for example, a cladding layer or a TSBR (tensile strain barrier reducing) layer.

The light-emitting layer 36 may be disposed between the first semiconductor layer 31 and the second semiconductor layer 32. The light-emitting layer 36 may include a single or multiple quantum well structure and material. When the light-emitting layer 36 includes the multiple quantum well structure and material, the light-emitting layer 36 may have a structure in which a plurality of quantum layers and a plurality of well layers are alternately stacked with each other. The light-emitting layer 36 may emit light via combinations of electrons and holes according to an electrical signal applied through the first semiconductor layer 31 and the second semiconductor layer 32. The light-emitting layer 36 may include a material, such as AlGaN and AlGaInN. For example, when the light-emitting layer 36 has a structure in which a plurality of quantum layers and a plurality of well layers are alternately stacked with each other, the quantum layer may include a material, such as AlGaN or AlGaInN, and the well layer may include a material, such as GaN or AlInN.

The light-emitting layer 36 may have a structure in which a plurality of first layers made of a semiconductor material having a larger (or relatively large) bandgap energy and a plurality of second layers made of a semiconductor material having a smaller (or relatively small) bandgap energy are alternately stacked with each other. The light-emitting layer 36 may include group III to group V semiconductor materials depending on a wavelength band of emitted light. The light emitted from the light-emitting layer 36 is not limited to light of a wavelength band corresponding to a blue color. In some embodiments, the light emitted from the light-emitting layer 36 may be light of a wavelength band corresponding to a red or green color.

The electrode layer 37 may be an ohmic connection electrode. The present disclosure is not, however, limited thereto. In some embodiments, the electrode layer 37 may be embodied as a Schottky connection electrode. The light-emitting element ED may include at least one electrode layer 37. The present disclosure is not, however, limited thereto. In some embodiments, the electrode layer 37 may be omitted.

The electrode layer 37 may reduce an electrical resistance between the light-emitting element ED and the electrode or the connection electrode when the light-emitting element ED is electrically connected to the electrode or the connection electrode in the display device 1. The electrode layer 37 may include a conductive metal. For example, the electrode layer 37 may include at least one of aluminum (Al), titanium (Ti), indium (In), gold (Au), silver, (Ag), ITO, IZO, and ITZO.

The insulating film 38 of the light-emitting element ED may protect the semiconductor layer(s) and the electrode layer(s) of the light-emitting element ED. The insulating film 38 may prevent an electrical short circuit that may otherwise occur in the light-emitting layer 36 when the light-emitting element ED is in direct contact with the electrode to which the electrical signal is transmitted. Further, the insulating film 38 may prevent deterioration of the luminous efficiency of the light-emitting element ED.

The insulating film 38 may be disposed to surround (or extend around) an outer face of each of the plurality of semiconductor layers 31 and 32, the light-emitting layer 36, and the electrode layer 37. For example, the insulating film 38 may be disposed to surround at least an outer face of the light-emitting layer 36 such that both opposing ends (e.g., opposite ends) in a longitudinal direction of the light-emitting element ED may be exposed. Further, the insulating film 38 may be formed in an area adjacent to at least one end of the light-emitting element ED to have a rounded top face in a cross-sectional view.

The insulating film 38 may include an insulative material, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). The drawing illustrates that the insulating film 38 is formed as a single layer. However, the present disclosure is not limited thereto. In some embodiments, the insulating film 38 may have a multiple layer structure in which a plurality of layers are stacked.

Each of the electrodes RME may have a structure in which a portion thereof disposed on each of the bank patterns BP1 and BP2 may reflect light emitted from the light-emitting element ED. Each of the first electrode RME1 and the second electrode RME2 may be disposed to at least partially cover one side face of each of the bank patterns BP1 and BP2 to reflect light emitted from the light-emitting element ED therefrom.

Each of the electrodes RME may directly contact the third conductive layer via each of electrode contact holes (e.g., contact openings) CTD and CTS in an area overlapping the bank layer BNL. The first electrode contact hole CTD may be formed in an area where the bank layer BNL and the first electrode RME1 overlap each other. The second electrode contact hole CTS may be formed in an area where the bank layer BNL and the second electrode RME2 overlap each other. The first electrode RME1 may contact the first conductive pattern CDP1 via the first electrode contact hole CTD extending through the first overcoat layer OC1 and the first protective layer PV1. The second electrode RME2 may contact the second voltage line VL2 via the second electrode contact hole CTS extending through the first overcoat layer OC1 and the first protective layer PV1. The first electrode RME1 may be electrically connected to the first transistor T1 via the first conductive pattern CDP1 and may receive the first power voltage. The second electrode RME2 may be electrically connected to the second voltage line VL2 so that the second power voltage may be applied thereto. However, the present disclosure is not limited thereto. In another embodiment, each of the electrodes RME1 and RME2 may not be electrically connected to each of the voltage lines VL1 and VL2 of the third conductive layer, and the connection electrode CNE, to be described later, may be directly connected to the third conductive layer.

Each of the plurality of electrodes RME may include a conductive material having high reflectivity. For example, each of the electrodes RME may include a metal, such as silver (Ag), copper (Cu), or aluminum (Al), an alloy including aluminum (Al), nickel (Ni), lanthanum (La), and the like, or a stack of a metal layer made of titanium (Ti), molybdenum (Mo), or niobium (Nb) and a layer made of the alloy. In some embodiments, each of the electrodes RME may have a double layer or multilayer structure in which at least one layer made of an alloy including aluminum (Al) and at least one layer made of titanium (Ti), molybdenum (Mo), or niobium (Nb) are stacked with each other.

However, the present disclosure is not limited thereto. Each of the electrodes RME may further include a transparent conductive material. For example, each of the electrodes RME may include a material, such as ITO (Indium Tin Oxide), IZO (Indium Zinc Oxide), ITZO (Indium Tin-Zinc Oxide), or the like. In some embodiments, each of the electrodes RME may have a structure in which at least one layer made of a transparent conductive material and at least one layer made of a metal having high reflectivity are stacked one on top of another or may have a single layer structure including the transparent conductive material and the metal having high reflectivity. For example, each of the electrodes RME may have a stack structure, such as ITO/silver(Ag)/ITO, ITO/Ag/IZO, or ITO/Ag/ITZO/IZO. The electrodes RME may be electrically connected to the light-emitting element ED and may reflect a portion of the light emitted from the light-emitting element ED upwardly from the substrate SUB.

The first insulating layer PAS1 may be disposed in an entirety of the display area DA and may be disposed on the first overcoat layer OC1 and the plurality of electrodes RME. The first insulating layer PAS1 may include an insulating material to protect the plurality of electrodes RME and electrically insulate different electrodes RME from each other. Because the first insulating layer PAS1 is disposed to cover the electrodes RME before the bank layer BNL is formed, the first insulating layer PAS1 may prevent the electrodes RME from being damaged in a process of forming the bank layer BNL. Further, the first insulating layer PAS1 may prevent the light-emitting element ED disposed thereon from being damaged due to direct contact with other members.

In some embodiments, the first insulating layer PAS1 may be stepped such that a portion of a top face thereof between the electrodes spaced apart from each other in the second direction DR2 is recessed (or depressed). The light-emitting element ED may be disposed on the recessed portion of the top face of the first insulating layer PAS1 such that a space may be formed between the light-emitting element ED and the first insulating layer PAS1.

The first insulating layer PAS1 may have contact holes (e.g., contact openings). The contact holes may overlap the different electrodes RME, respectively. For example, the contact holes may include a first contact hole overlapping the first electrode RME1 and a second contact hole overlapping the second electrode RME2. Each of the first contact hole and the second contact hole may extend through the first insulating layer PAS1 to expose a portion of a top face of each of the first electrode RME1 and the second electrode RME2 disposed thereunder. The first contact hole and the second contact hole may extend through a portion of an insulating layer other than and disposed on the first insulating layer PAS1. The portion of the electrode RME exposed through each of the contact holes may come into contact with the connection electrode CNE.

The bank layer BNL may be disposed on the first insulating layer PAS1. The bank layer BNL may be formed in a grid pattern with a portion extending in the first direction DR1 and a portion extending in the second direction DR2 in a plan view. The bank layer BNL may extend along (e.g., may extend around or surround in a plan view) a boundary of each sub-pixel SPXn to distinguish neighboring sub-pixels SPXn from each other. The bank layer BNL may surround (e.g., may extend around) the outermost edge of the display area DA and may distinguish the display area DA and the non-display area NDA from each other.

The light-emitting elements ED may contact the connection electrodes CNE (e.g., CNE1 and CNE2) and, thus, may be electrically connected to the electrodes RME and to the conductive layers under the first overcoat layer OC1. The light-emitting elements ED may receive the electric signal to emit light in a specific wavelength band.

In some embodiments, a vertical level of a top face of the bank layer BNL may be higher than that (e.g., with respect to the substrate SUB) of a top face of each of the bank patterns BP1 and BP2. A thickness of the bank layer BNL may be equal to or greater than that of each of the bank patterns BP1 and BP2. However, the present disclosure is not limited thereto. The bank layer BNL may prevent ink in (e.g., deposited in) one sub-pixel SPX from overflowing into another sub-pixel SPX adjacent thereto. The bank layer BNL may include an organic insulating material, such as polyimide (PI), as in each of the bank patterns BP1 and BP2. However, the present disclosure is not limited thereto.

The second insulating layer PAS2 may be disposed on the plurality of light-emitting elements ED, the first insulating layer PAS1, and the bank layer BNL. The second insulating layer PAS2 includes a pattern portion extending in the first direction DR1 between the bank patterns BP1 and BP2 and disposed on a plurality of light-emitting elements ED. The pattern portion may be disposed to partially cover an outer face of the light-emitting element ED but may not cover both opposite sides or both opposite ends of the light-emitting element ED. The pattern portion may have a linear or island-shaped pattern in each sub-pixel SPXn in a plan view. The pattern portion of the second insulating layer PAS2 may protect the light-emitting element ED and may fix the light-emitting element ED in a manufacturing process of the display device 1. Further, the second insulating layer PAS2 may fill a space between the light-emitting element ED and the first insulating layer PAS1 thereunder. Further, a portion of the second insulating layer PAS2 may be disposed on a top face of the bank layer BNL.

The second insulating layer PAS2 may have contact holes (e.g., contact openings) formed therein. The second insulating layer PAS2 may have a first contact hole disposed to overlap the first electrode RME1 and a second contact hole disposed to overlap the second electrode RME2. The contact holes may extend through the second insulating layer PAS2 and the first insulating layer PAS1. A plurality of first contact holes and a plurality of second contact holes may respectively expose a portion of a top face of the first electrode RME1 and the second electrode RME2 thereunder.

The plurality of connection electrodes CNE (e.g., CNE1 and CNE2) may be respectively disposed on the plurality of electrodes RME (e.g., RME1 and RME2) and the bank patterns BP1 and BP2. The first connection electrode CNE1 may be disposed on the first electrode RME1 and the first bank pattern BP1. The first connection electrode CNE1 may partially overlap the first electrode RME1 and may extend from the light-emitting area beyond the bank layer BNL. The second connection electrode CNE2 may be disposed on the second electrode RME2 and the second bank pattern BP2. The second connection electrode CNE2 may partially overlap the second electrode RME2 and may extend from the light-emitting area beyond the bank layer BNL.

Each of the first connection electrode CNE1 and the second connection electrode CNE2 may be disposed on the second insulating layer PAS2 and may contact the light-emitting elements ED. The first connection electrode CNE1 may partially overlap the first electrode RME1 and may contact one end of each of the light-emitting elements ED. The second connection electrode CNE2 may partially overlap the second electrode RME2 and contact the other end of each of the light-emitting elements ED. The connection electrodes CNE may be in contact with the light-emitting elements ED and may be electrically connected to the third conductive layer. The first connection electrode CNE1 may contact a first end of each of the light-emitting elements ED, and the second connection electrode CNE2 may contact a second end of each of the light-emitting elements ED.

According to an embodiment, in the display device 1, each of the connection electrodes CNE may contact the electrode RME via each of contact holes. The first connection electrode CNE1 may contact the first electrode RME1 via the first contact hole extending through the first insulating layer PAS1, the second insulating layer PAS2, and the third insulating layer PAS3. The second connection electrode CNE2 may contact the second electrode RME2 via the second contact hole extending through the first insulating layer PAS1 and the second insulating layer PAS2. Each connection electrode CNE may be electrically connected to the third conductive layer via each electrode RME. The first connection electrode CNE1 may be electrically connected to the first transistor T1 so that the first power voltage is applied to the first connection electrode CNE1. The second connection electrode CNE2 may be electrically connected to the second voltage line VL2 so that the second power voltage may be applied to the second connection electrode CNE2. Each connection electrode CNE may contact the light-emitting element ED in the light-emitting area and, thus, may transmit the power voltage to the light-emitting element ED.

Each of the connecting electrodes CNE may include a conductive material. For example, the conductive material may include ITO, IZO, ITZO, aluminum (Al), etc. For example, the connection electrode CNE may include a transparent conductive material, such that light emitted from the light-emitting element ED may travel through the connection electrode CNE.

The third insulating layer PAS3 is disposed on the second connection electrode CNE2 of a first connection electrode layer and the second insulating layer PAS2. The third insulating layer PAS3 may be disposed on an entirety of the second insulating layer PAS2 to cover the second connection electrode CNE2. The first connection electrode CNE1 of a second connection electrode layer may be disposed on the third insulating layer PAS3. The third insulating layer PAS3 may electrically insulate the first connection electrode CNE1 and the second connection electrode CNE2 from each other so that the first connection electrode CNE1 does not directly contact the second connection electrode CNE2.

The third insulating layer PAS3 may include the first contact holes. The first contact hole may extend through the first insulating layer PAS1, the second insulating layer PAS2, and the third insulating layer PAS3. A plurality of first contact holes may expose a portion of a top face of the first electrode RME1 disposed thereunder.

The fourth insulating layer PAS4 may be disposed on the third insulating layer PAS3, the connection electrodes CNE1 and CNE2, and the bank layer BNL. The fourth insulating layer PAS4 may protect the layers disposed on the substrate SUB. However, in some embodiments, the fourth insulating layer PAS4 may be omitted.

The upper bank layer UBN, the color control structure TPL, WCL1, and WCL2, the color pattern CP1, CP2, and CP3, and the color filter layer CFL1, CFL2, and CFL3 may be disposed on the fourth insulating layer PAS4. A plurality of capping layers CPL1 and CPL2, the low refractive index layer LRL, and the second overcoat layer OC2 may be disposed between the color control structure TPL, WCL1, and WCL2 and the color filter layer CFL1, CFL2, and CFL3. The third overcoat layer OC3 may be disposed on the color filter layer CFL1, CFL2, and CFL3.

Each of the first insulating layer PAS1, the second insulating layer PAS2, the third insulating layer PAS3, and the fourth insulating layer PAS4 may include an inorganic insulating material or an organic insulating material. In some embodiments, each of the first insulating layer PAS1, the second insulating layer PAS2, the third insulating layer PAS3, and the fourth insulating layer PAS4 may include one of silicon oxide ($SiO_x$), silicon nitride ($SiN_x$), and silicon oxynitride ($SiOxN_y$). Each of the first insulating layer PAS1, the second insulating layer PAS2, the third insulating layer PAS3 and the fourth insulating layer PAS4 may be made of the same material. Some thereof may be made of the same material and the other(s) thereof may be made of different materials. In other embodiments, the first insulating layer PAS1, the second insulating layer PAS2, the third insulating layer PAS3 and the fourth insulating layer PAS4 may be made of different materials.

The upper bank layer UBN may be disposed on the fourth insulating layer PAS4 to overlap the bank layer BNL. The upper bank layer UBN may be formed in a grid pattern with a portion extending in the first direction DR1 and a portion extending in the second direction DR2. The upper bank layer UBN may surround (e.g., may extend around a periphery of) the light-emitting area or an area in which the light-emitting elements ED are disposed. The upper bank layer UBN may define an area in which the color control structure TPL, WCL1, and WCL2 is disposed.

The color control structure TPL, WCL1, and WCL2 may be disposed on the fourth insulating layer PAS4 and in an area surrounded by the upper bank layer UBN. The color control structures TPL, WCL1, and WCL2 may be respectively disposed in the light-emitting areas LA1, LA2, and LA3, each surrounded by the upper bank layer UBN. Thus, each of the color control structures TPL, WCL1, and WCL2 may be formed in an island-like pattern in the display area DA. However, the present disclosure is not limited thereto, and each of the color control structures TPL, WCL1, and WCL2 may be formed in a linear pattern extending in one direction and across the plurality of sub-pixels SPXn.

In an embodiment in which the light-emitting element ED of each sub-pixel SPXn emits light of the blue color as the third color, the color control structure TPL, WCL1, and WCL2 may include a first wavelength conversion layer WCL1 corresponding to the first light-emitting area LA1 and disposed in the first sub-pixel SPX1, a second wavelength conversion layer WCL2 disposed in the second sub-pixel SPX2 and corresponding to the second light-emitting area LA2, and a light-transmissive layer TPL disposed in the third sub-pixel SPX3 and corresponding to the third light-emitting area LA3.

The first wavelength conversion layer WCL1 may include a first base resin BRS1 and a first wavelength conversion material WCP1 contained within (e.g., suspended in) the first base resin BRS1. The second wavelength conversion layer WCL2 may include a second base resin BRS2 and a second wavelength conversion material WCP2 contained within the second base resin BRS2. Each of the first wavelength conversion layer WCL1 and the second wavelength conversion layer WCL2 may convert a wavelength of the third color (e.g., blue) light incident thereto from the light-emitting element ED and may output light having the converted wavelength. Each of the first wavelength conversion layer WCL1 and the second wavelength conversion layer WCL2 may further include scattering particles SCP contained in each of the base resins. The scattering particles SCP may increase the wavelength conversion efficiency.

The light-transmissive layer TPL may include a third base resin BRS3 and scattering particles SCP contained in the third base resin BSR3. The light-transmissive layer TPL transmits the third color (e.g., blue) light incident thereto from the light-emitting element ED therethrough while maintaining a wavelength thereof. The scattering particles SCP of the light-transmissive layer TPL may play a role in controlling an emission path of light emitted through the light-transmissive layer TPL. The light-transmissive layer TPL may be free of (e.g., may not include or may omit) a wavelength conversion material.

The scattering particles SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The organic particle material may include acrylic resin or urethane resin.

Each of the first to third base resins BRS1, BRS2, and BRS3 may include a light-transmissive organic material. For example, each of the first to third base resins BRS1, BRS2, and BRS3 may include an epoxy-based resin, an acrylic-based resin, a cardo-based resin, or an imide-based resin. All of the first to third base resins BRS1, BRS2, and BRS3 may be made of the same material. However, the present disclosure is not limited thereto.

The first wavelength conversion material WCP1 may convert blue light as light of the third color into red light as light of the first color, and the second wavelength conversion material WCP2 may convert blue light as light of the third color into green light as light of the second color. Each of the first wavelength conversion material WCP1 and the second wavelength conversion material WCP2 may include a quantum dot, a quantum rod, phosphor, or etc. The quantum dot may include group IV nanocrystals, group II-VI compound nanocrystals, group III-V compound nanocrystals, group IV-VI nanocrystals, or a combination thereof.

In some embodiments, the color control structure TPL, WCL1, and WCL2 may be formed by using an inkjet printing process or a photoresist process. The color control structure TPL, WCL1, and WCL2 may be formed by spraying or applying a material constituting the color control structure TPL, WCL1, and WCL2 into the area surrounded by the upper bank layer UBN and performing drying or exposure and development processes thereon. For example, in an embodiment in which the color control structure TPL, WCL1, and WCL2 is formed by using the inkjet printing process, a top face of the color control structure TPL, WCL1, and WCL2 may be formed to be curved so that a vertical level of an edge portion thereof adjacent to the upper bank layer UBN may be higher than that of a center portion thereof (see, e.g., FIG. 3). However, the present disclosure is not limited thereto. In an embodiment in which the color control structure TPL, WCL1, and WCL2 is formed by using a photoresist process, a top face of the color control structure TPL, WCL1, and WCL2 may be formed to be flat so that the edge portion thereof adjacent to the upper bank layer UBN may be parallel to a top face of the UBN or a vertical level of the edge portion thereof adjacent to the upper bank layer UBN may be lower than that of the center portion thereof.

The light-emitting elements ED of the sub-pixels SPXn may emit blue light as light of the same third color. However, light emitted from the sub-pixels SPXn may render different colors. For example, light emitted from the light-emitting element ED disposed on the first sub-pixel SPX1 is incident on the first wavelength conversion layer WCL1. The light emitted from the light-emitting element ED disposed on the second sub-pixel SPX2 is incident on the second wavelength conversion layer WCL2. The light emitted from the light-emitting element ED disposed on the third sub-pixel SPX3 is incident on the light-transmissive layer TPL. The light incident on the first wavelength conversion layer WCL1 may be converted to red light, the light incident on the second wavelength conversion layer WCL2 may be converted to green light, and the light incident on the light-transmissive layer TPL may transmit therethrough while the wavelength thereof is maintained. Although the sub-pixels SPXn include the light-emitting elements ED that emit light of the same color, the sub-pixels SPXn may eventually emit light of different colors based on the configurations of the color control structures TPL, WCL1, and WCL2 respectively disposed on the sub-pixels SPXn.

The first capping layer CPL1 may be disposed on the color control structures TPL, WCL1, and WCL2 and the upper bank layer UBN. The first capping layer CPL1 may prevent impurities, such as moisture or air, from permeating from the outside to the color control structures TPL, WCL1, and WCL2 to damage or contaminate the color control structures TPL, WCL1, and WCL2. The first capping layer CPL1 may include an inorganic insulating material.

The low refractive index layer LRL may be disposed on the first capping layer CPL1. The low refractive index layer LRL refers to an optical layer that recycles (e.g., reflects) light that has passed through the color control structures TPL, WCL1, and WCL2 and may improve light output efficiency and color purity of the display device 1. The low refractive index layer LRL may be made of an organic material having a low refractive index and may remove (or planarize) a step caused by the color control structures TPL, WCL1, WCL2, and the upper bank layer UBN.

The second capping layer CPL2 is disposed on the low refractive index layer LRL to prevent impurities, such as moisture or air, from permeating from the outside to the low refractive index layer LRL to damage or contaminate the low refractive index layer LRL. The second capping layer CPL2 may include an inorganic insulating material in a similar manner to the first capping layer CPL1.

The second overcoat layer OC2 may be disposed on the second capping layer CPL2 and over an entirety of each of the display area DA and the non-display area NDA. The second overcoat layer OC2 may overlap the color control structures TPL, WCL1, and WCL2 in the display area DA and may overlap a dam structure (see, e.g., DAM in FIG. 8) and a valley (see, e.g., VA in FIG. 8), which will be described later, in the non-display area NDA.

The second overcoat layer OC2 protects not only the plurality of capping layers CPL1 and CPL2 and the low refractive index layer LRL but also the members disposed on the substrate SUB and partially removes (e.g., partially planarizes) a step caused thereby. For example, the second overcoat layer OC2 may remove (or planarize) a step formed by the color control structures TPL, WCL1, WCL2 and the upper bank layer UBN and the bank layer BNL disposed thereunder in the display area DA such that the color filter layer CFL1, CFL2, and CFL3 disposed thereon may be formed on a planarized surface.

A plurality of color filter layers CFL1, CFL2, and CFL3 may be disposed on the second overcoat layer OC2. The color filter layers CFL1, CFL2, and CFL3 may be respectively disposed in the light-emitting areas LA1, LA2, and LA3, while a portion of each of the color filter layers CFL1, CFL2, and CFL3 may be disposed in the light-blocking area BA. One of the color filter layers CFL1, CFL2, and CFL3 may overlap another of the color filter layers CFL1, CFL2, and CFL3 and/or each of color patterns CP1, CP2, and CP3 in the light-blocking area BA. An area where one of the color filter layers CFL1, CFL2, and CFL3 does not overlap with another of the color filter layers CFL1, CFL2, and CFL3 may be each of the light-emitting areas LA1, LA2, and LA3 from where light is emitted. An area in which the different color filter layers CFL1, CFL2, and CFL3 overlap each other or an area in which each of the color patterns CP1, CP2, and CP3 is disposed may be the light-blocking area BA where light emission is blocked.

The color filter layers CFL1, CFL2, and CFL3 may include the first color filter layer CFL1 disposed in the first sub-pixel SPX1, the second color filter layer CFL2 disposed in the second sub-pixel SPX2, and the third color filter layer CFL3 disposed in the third sub-pixel SPX3. Each of the color filter layers CFL1, CFL2, and CFL3 may be formed in a linear pattern disposed in each of the plurality of light-emitting areas LA1, LA2, and LA3. However, the present disclosure is not limited thereto. Each of the color filter layers CFL1, CFL2, and CFL3 may be disposed in a corresponding manner to each of the light-emitting areas LA1, LA2, and LA3 and may be formed in an island-like pattern.

The color filter layer CFL1, CFL2, CFL3 may include colorant such as dye or pigment that absorbs light in wavelength bands than other a specific wavelength band. Each of the color filter layers CFL1, CFL2, and CFL3 may be disposed in each of the sub-pixels SPXn and may transmit therethrough only a portion of the light incident thereto from the corresponding sub-pixel SPXn. In each sub-pixel SPXn of the display device 1, only light transmitting through each of the color filter layers CFL1, CFL2, and CFL3 may be selectively displayed. In an embodiment, the first color filter layer CFL1 may be a red color filter layer, the second color filter layer CFL2 may be a green color filter layer, and the third color filter layer CFL3 may be a blue color filter layer. Light beams emitted from the light-emitting elements ED may pass through the color control structures TPL, WCL1, and WCL2 and may travel through the color filter layers CFL1, CFL2, and CFL3, respectively.

The color pattern CP1, CP2, and CP3 may be disposed on the second overcoat layer OC2 or the color filter layer CFL1, CFL2, and CFL3. The color pattern CP1, CP2, and CP3 may be disposed in the light-blocking area BA and may include the same material as that of the color filter layer CFL1, CFL2, and CFL3. In the light-blocking area BA, each of the color patterns CP1, CP2, and CP3 and different ones of the color filter layers CFL1, CFL2, and CFL3 may be stacked. Thus, transmission of light may be blocked in the light-blocking area BA.

The first color pattern CP1 may be disposed in the light-blocking area BA and may include the same material as that of the first color filter layer CFL1. The first color pattern CP1 may be disposed directly on the second overcoat layer OC2 and in a light-blocking area BA between the second light-emitting area LA2 and the third light-emitting area LA3 and may be absent in (e.g., may not be formed in) a light-blocking area BA adjacent to the first light-emitting area LA1 of the first sub-pixel SPX1. The first color pattern CP1 may be disposed in the light-blocking area BA between the second sub-pixel SPX2 and the third sub-pixel SPX3. The first color filter layer CFL1 may be disposed in the light-blocking areas BA around the first sub-pixel SPX1.

The second color pattern CP2 may be disposed in the light-blocking area BA and may include the same material as that of the second color filter layer CFL2. The second color pattern CP2 may be disposed indirectly on the second overcoat layer OC2 and in the light-blocking area BA and may be absent in the light-blocking area BA adjacent to the second light-emitting area LA2 of the second sub-pixel SPX2. The second color pattern CP2 may be disposed in the light-blocking area BA between the first sub-pixel SPX1 and the third sub-pixel SPX3 or in a boundary between the outermost sub-pixel SPXn of the display area DA and the non-display area NDA. The second color filter layer CFL2 may be disposed in the light-blocking areas BA around the second sub-pixel SPX2.

Similarly, the third color pattern CP3 may be disposed in the light-blocking area BA and may include the same material as that of the third color filter layer CFL3. The third color pattern CP3 may be disposed indirectly on the second overcoat layer OC2 in the light-blocking area BA and may be absent in the light-blocking area BA adjacent to the third light-emitting area LA3 of the third sub-pixel SPX3. The third color pattern CP3 may be disposed in a light-blocking area BA between the first sub-pixel SPX1 and the second sub-pixel SPX2. The third color filter layer CFL3 may be disposed in the light-blocking areas BA around the third sub-pixel SPX3.

In the display device 1, an area overlapping the bank layer BNL and the upper bank layer UBN may be the light-blocking area BA. In the light-blocking area BA, each of the first color pattern CP1, the second color pattern CP2, and the third color pattern CP3 may be disposed to overlap at least one of the color filter layers CFL1, CFL2, and CFL3 corresponding to a color other than a color of the corresponding color pattern. For example, the first color pattern CP1 may overlap the second color filter layer CFL2 and the third color filter layer CFL3. The second color pattern CP2 may overlap the first color filter layer CFL1 and the third color filter layer CFL3. The third color pattern CP3 may overlap the first color filter layer CFL1 and the second color filter layer CFL2. Thus, in the light-blocking area BA, at least one of the color patterns CP1, CP2, and CP3 and at least one of the color filter layers CFL1, CFL2, and CFL3 corresponding to a different color(s) may overlap each other, thereby blocking light transmission.

At least one of the plurality of color patterns CP1, CP2, and CP3 and at least one of the color filter layers CFL1, CFL2, and CFL3 corresponding to the different colors may be vertically stacked with each other, thereby preventing mixing between colors of adjacent sub-pixels.

The third overcoat layer OC3 may be disposed on the color filter layers CFL1, CFL2, and CFL3 and the color patterns CP1, CP2, and CP3. The third overcoat layer OC3 may be disposed over an entirety of the display area DA, and a portion of the third overcoat layer may also be disposed in the non-display area NDA. The third overcoat layer OC3 may include an organic insulating material to protect the members disposed in the display area DA from the outside. A top face of the third overcoat layer OC3 may be a top face of the display panel 300.

The film member 100 and the conductive layer 200 may be disposed on the third overcoat layer OC3. For example, the film member 100 may be disposed on the third overcoat layer OC3, and the conductive layer 200 may be disposed between the film member 100 and the third overcoat layer OC3. An adhesive layer ADH may be interposed between the conductive layer 200 and the third overcoat layer so that the third overcoat layer OC3 and the conductive layer 200 may be bonded to each other via the adhesive layer ADH. Further, a separate adhesive member may be interposed between the conductive layer 200 and the film member 100 so that the film member 100 and the conductive layer 200 may be attached to each other via the separate adhesive member.

The film member 100 may protect the top face of the display device 1, as described above. The film member 100 may include a base film 130 and an anti-fingerprint film 110 disposed on the base film 130. The anti-fingerprint film 110 may be the topmost portion (or topmost surface) of the display device 1.

The anti-fingerprint film 110 of the film member 100 may prevent a fingerprint of a user using the display device 1 from remaining thereon. Because a structure of the anti-fingerprint film 110 is generally known in the art, a detailed description thereof will be omitted.

The base film 130 of the film member 100 may be a base of the film member 100. The base film 130 may include a rigid material. In some embodiments, the base film 130 may include, but is not limited to, cellulose triacetate (triacetate or TAC). As described above, the base film 130 may be rigid to some extent to protect the display device 1 from the outside.

In one example, a hand of the user of the display device 1 may directly touch the film member 100. Thus, static electricity may be generated in the film member 100 due to, for example, the user's handling. If the static electricity generated in the film member 100 cannot be discharged (or easily discharged), the static electricity generated in the film member 100 may damage the display panel 300.

The conductive layer 200 may provide a path for discharging the static electricity generated in the film member 100. The conductive layer 200 may be disposed on a bottom face of the film member 100. The conductive layer 200 may have substantially the same area and width as that of the film member 100 and may entirely overlap the film member 100. However, the present disclosure is not limited thereto. For example, the conductive layer 200 may have a smaller area than that of the film member 100. Hereinafter, for convenience of description, following description described an embodiment in which the areas of the film member 100 and the conductive layer 200 are substantially equal to each other.

The conductive layer 200 may include a conductive and transparent material. Accordingly, a path for discharging the static electricity generated in the film member 100 while not blocking light transmission in the display area DA may be provided. In some embodiments, the conductive layer 200 may include, but is not limited to, a transparent metal oxide, such as indium tin oxide (ITO).

The chassis member 500 may support the bottom face of the display panel 300 to increase the mechanical strength thereof as described above. The chassis member 500 may be disposed on the bottom face of the display panel 300, that is, a bottom face of the substrate SUB of the display panel 300. The chassis member 500 may include a conductive metal.

A heat dissipation layer GP may be disposed between the chassis member 500 and the display panel 300. The heat dissipation layer GP may serve to shield electromagnetic waves emitted from the display panel 300. In some embodiments, the heat dissipation layer GP may include graphite. However, the present disclosure is not limited thereto.

The chassis member 500 may be electrically connected to the conductive layer 200 via a sealing member 700, as will be described later. Accordingly, the static electricity that transmits to the conductive layer 200 may travel through the sealing member 700 to be discharged from (or via) the chassis member 500. Hereinafter, the sealing member 700 will be described in detail.

Figure 6:
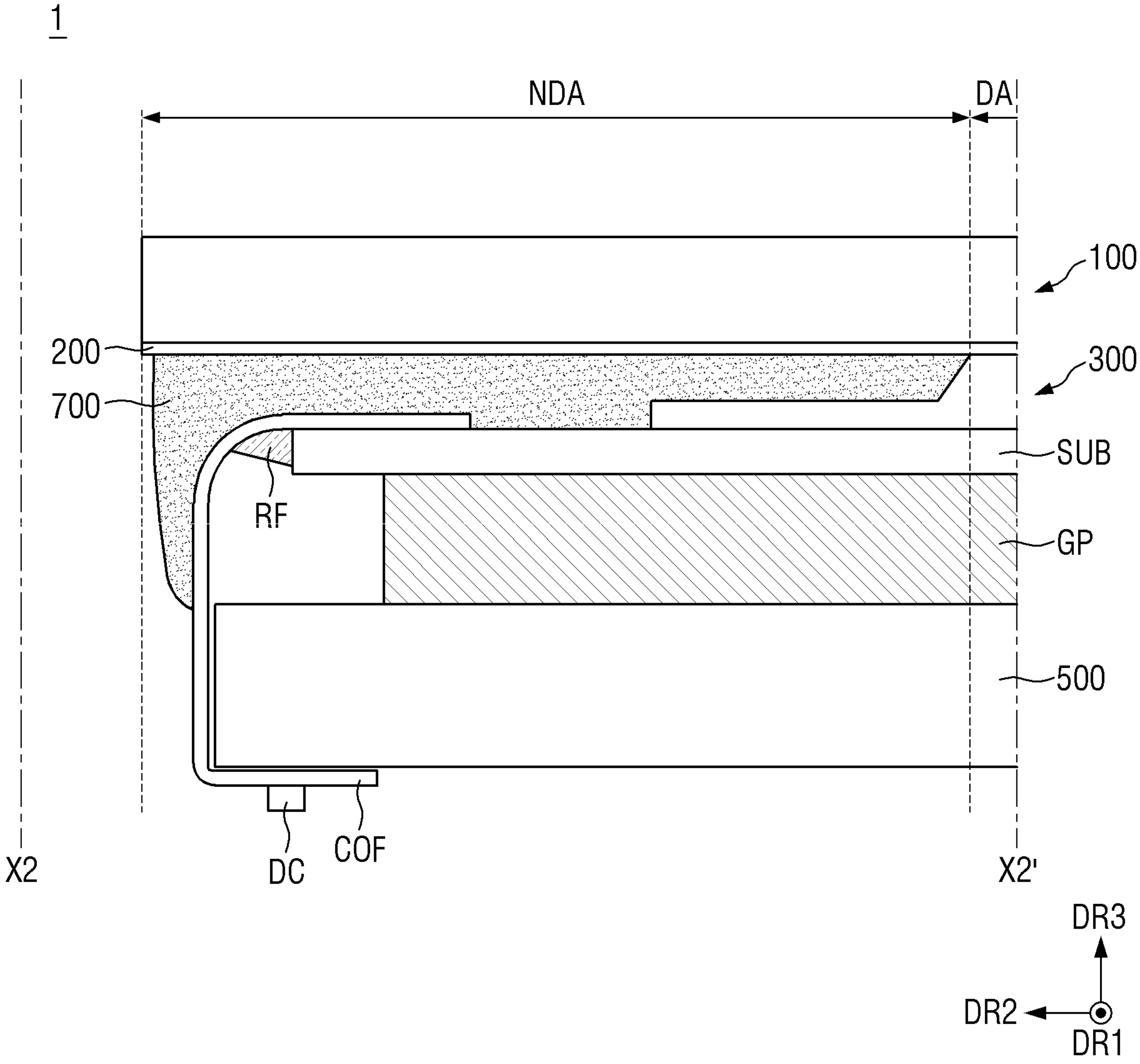
FIG. 6 is a cross-sectional view schematically showing a cross section taken along the line X2-X2' in FIG. 2.
Figure 7:
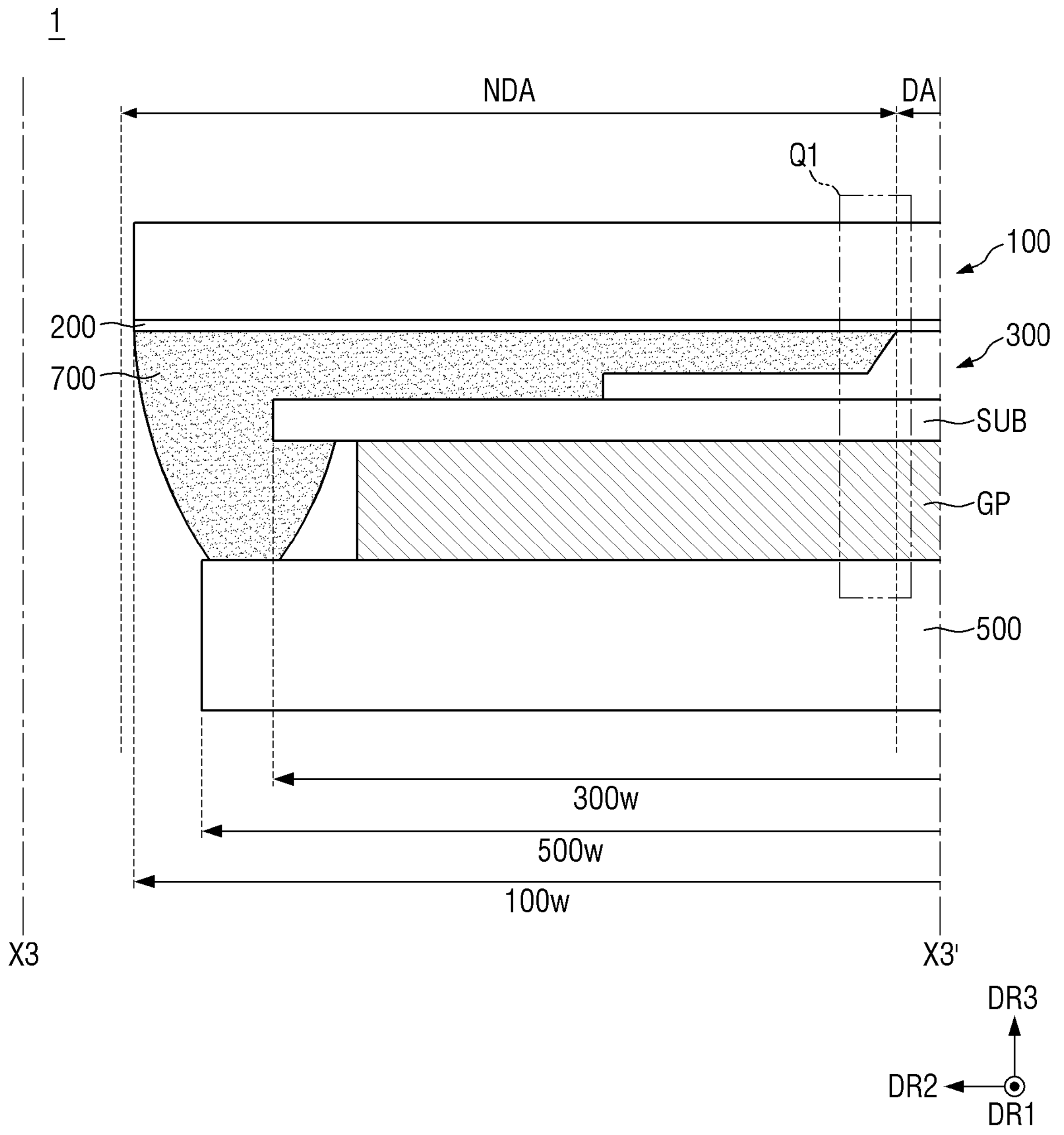
FIG. 7 is a cross-sectional view schematically showing a cross section taken along the line X3-X3' in FIG. 2.
Figure 8:
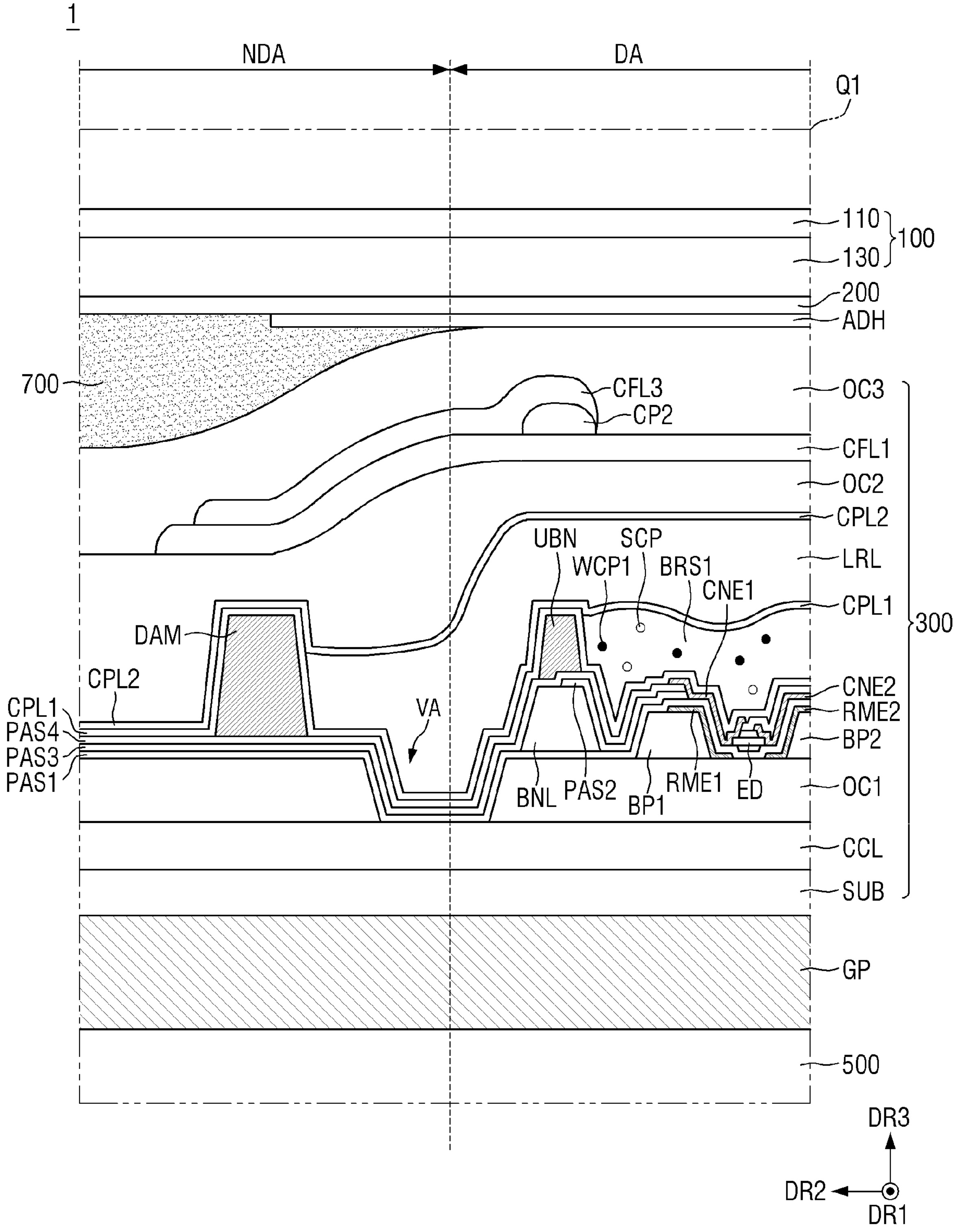
FIG. 8 is an enlarged view of the area Q1 of FIG. 7.

FIG. 6 is a cross-sectional view schematically showing a cross section taken along the line X2-X2' in FIG. 2, FIG. 7 is a cross-sectional view schematically showing a cross section taken along the line X3-X3' in FIG. 2, and FIG. 8 is an enlarged view of the area Q1 of FIG. 7.

Referring to FIG. 6 and FIG. 7, in the display device 1 according to an embodiment, a dimension of the film member 100 in the second direction DR2 is larger than a dimension of the chassis member 500 in the second direction DR2, which is larger than a dimension of the display panel 300 in the second direction DR2. A step formed by a difference between the widths in the second direction DR2 of adjacent members is formed in the non-display area NDA. In the non-display area NDA, adjacent ones of the film member 100, the display panel 300, and the chassis member 500 are spaced apart from each other to form spaces therebetween. The sealing member 700 may be received in the spaces to cover a side face of the display panel 300. In some embodiments, the dimension of the film member 100 in the second direction DR2 and the dimension of the conductive layer 200 in the second direction DR2 may be substantially the same as each other. However, the present disclosure is not limited thereto. Hereinafter, for convenience of description, following description describes an embodiment in which the dimension of the conductive layer 200 in the second direction DR2 is substantially equal to the dimension of the film member 100 in the second direction DR2.

The sealing member 700 may cover the side face of the display panel 300, may bond the film member 100 and the chassis member 500 to each other to increase the mechanical stability of the display device 1, and may receive the static electricity from the conductive layer 200 and transfer the static electricity to the chassis member 500. The sealing member 700 may include a conductive material. The sealing member 700 may be in direct contact with a bottom face of the conductive layer 200 in an area where the flexible printed circuit board COF is not disposed and, thus, may be electrically connected to the conductive layer 200.

The sealing member 700 may be disposed on one face of the flexible printed circuit board COF in an area where the flexible printed circuit board COF is disposed, as shown in FIG. 6 and, thus, may cover a portion of one face of the flexible printed circuit board COF. The flexible printed circuit board COF may be disposed at an end of the substrate SUB of the display panel 300 and may be bent toward the chassis member 500 and attached to a bottom face of the chassis member 500. A driver chip DC that generates a driving signal may be mounted on the flexible printed circuit board COF. In some embodiments, the driver chip DC may be disposed on one face of the flexible printed circuit board COF to face outwardly of the display device 1. However, the present disclosure is not limited thereto. Resin RF may be interposed between the flexible printed circuit board COF and the side face of the substrate SUB of the display panel 300. The resin RF may remove (or reduce) a step in the second direction DR2 between the display panel 300 and the chassis member 500 to relieve stress that may be applied to the flexible printed circuit board COF due to bending of the flexible printed circuit board COF.

The sealing member 700 may directly contact a top face of the chassis member 500 in a space (see, e.g., FIG. 2) between adjacent ones of the plurality of flexible printed circuit boards COF, as shown in FIG. 7. Because the dimension of the chassis member 500 in the second direction DR2 and the dimension of the conductive layer 200 in the second direction DR2 (or the dimension of the film member 100 in the second direction DR2) is larger than the dimension of the display panel 300 in the second direction DR2, a portion exposed from the display panel 300 in the third direction DR3 is defined in each non-display area NDA so that the film member 100 and the chassis member 500 are spaced apart from each other to form a space therebetween. Thus, the sealing member 700 may be received (or formed) in the space between the film member 100 and the chassis member 500 to directly contact the bottom face of the conductive layer 200 and the top face of the chassis member 500.

In one embodiment, several members disposed on the substrate SUB of the display panel 300 may form a stepped downward inclination toward the bottom face of the display panel 300 in an area adjacent to a boundary between the display area DA and the non-display area NDA. Accordingly, adjacent ones of the film member 100, the conductive layer 200, and the substrate SUB of the display panel 300 may be spaced apart from each other, and the sealing member 700 may be interposed therebetween.

Hereinafter, a shape of the sealing member 700 received in the spaces between adjacent ones of the film member 100, the conductive layer 200, and the substrate SUB of the display panel 300 in the vicinity of the boundary between the non-display area NDA and the display area DA, and a portion where the conductive layer 200 and the sealing member 700 begin to directly contact each other will be described.

Figure 9:
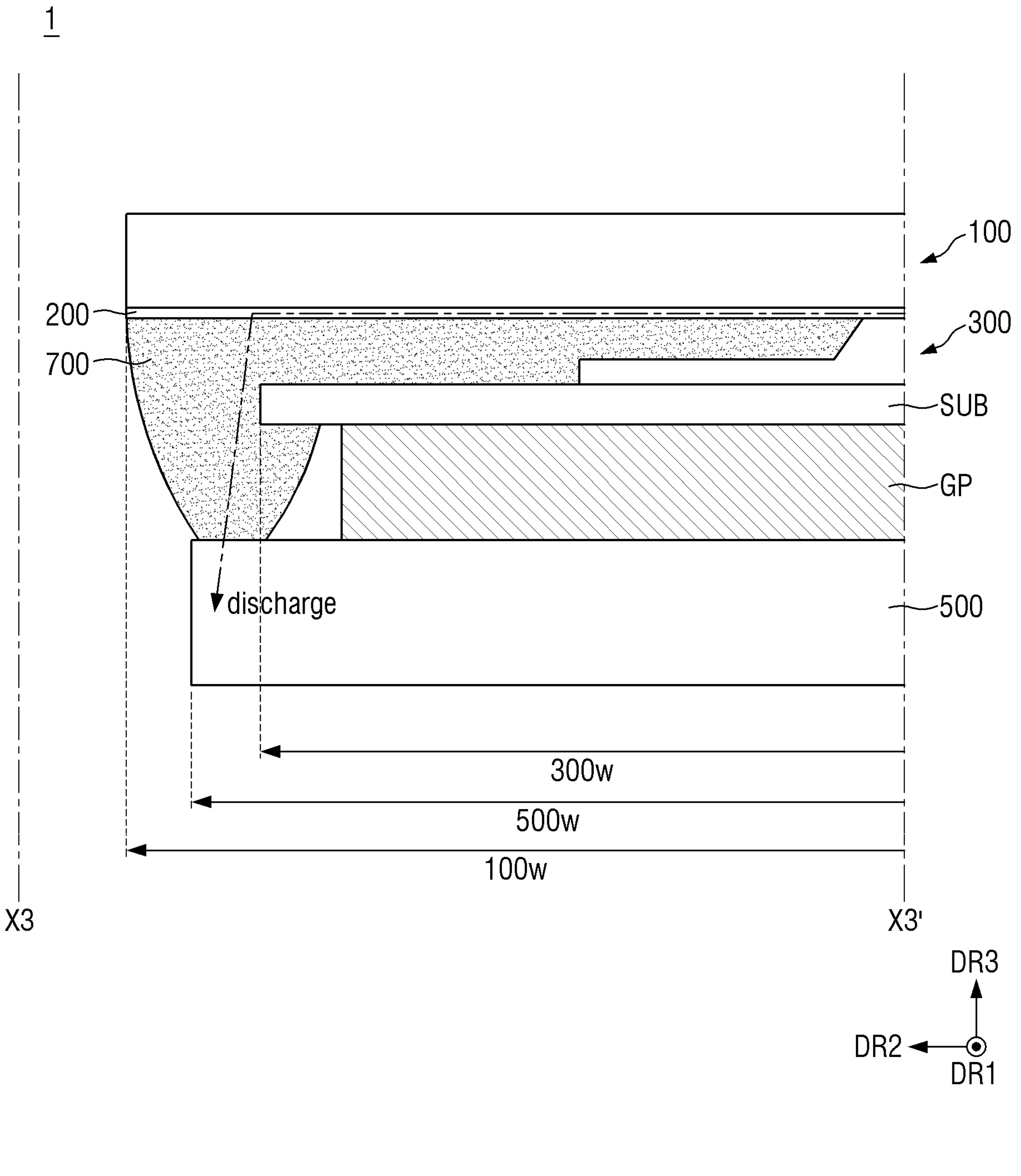
FIG. 9 is a diagram showing a path through which static electricity generated in a film member is discharged.

FIG. 8 is an enlarged view of the area Q1 of FIG. 7, and FIG. 9 is a diagram showing a path through which static electricity generated in the film member is discharged.

Referring to FIG. 8, the display panel 300 according to an embodiment does not include the light-emitting element in the non-display area NDA. Thus, a dimension of the panel in the non-display area NDA in the third direction DR3 may be smaller than a dimension of the panel in the display area DA in the third direction DR3.

For example, the non-display area NDA refers to an area at where the light-emitting element ED is not disposed and, thus, an image is not displayed. Thus, several components adjacent to the light-emitting element ED, for example, the bank patterns BP1 and BP2, the first electrode RME1, the second electrode RME2, the first connection electrode CNE1, the second connection electrode CNE2, the color control structures WCL1, WCL2, TPL, etc. may not be disposed in the non-display area NDA. Rather, in the non-display area NDA of the display panel 300, a dam DAM is disposed on the first overcoat layer OC1 to prevent the low-refractive layer LRL from overflowing to the non-display area NDA. A valley VA extends through the first overcoat layer OC1 at a position adjacent to the boundary between the non-display area NDA and the display area DA of the display panel 300. Accordingly, the first overcoat layer OC1 is depressed (or recessed) concavely toward the other side in the third direction DR3 at the position near the boundary of the non-display area NDA and the display area DA. The low refractive index layer LRL may fill the valley VA during a formation process thereof to form a step and may not overflow into the non-display area NDA due to the dam DAM.

As described above, a step of the display panel 300 is formed between the film member 100 and the display panel 300. Thus, the display panel 300 and the film member 100 are spaced apart from each other in the non-display area NDA. The sealing member 700 fills the space between the display panel 300 and the film member 100.

The adhesive layer ADH that bonds the third overcoat layer OC3 and the conductive layer 200 to each other may extend to the non-display area NDA but may not extend entirely through the non-display area NDA. Accordingly, the bottom face of the conductive layer 200 may be partially exposed in the non-display area NDA. Accordingly, the sealing member 700 received in the space between the display panel 300 and the film member 100 in the non-display area NDA may come into direct contact with the bottom face of the conductive layer 200.

In the configuration as described above, the static electricity generated in the film member 100 may be transmitted to the sealing member 700 via the conductive layer 200 as shown in, e.g., FIG. 9. The sealing member 700 may transmit the static electricity to the chassis member 500. The chassis member 500 may eventually discharge the static electricity. Accordingly, the display device 1 according to an embodiment may protect the various elements of the display panel 300 from the static electricity that may be generated from the film member 100.

Hereinafter, other embodiments of the display device 1 will be described. In the following embodiments, the same reference numerals refer to the same components as those of the previously described embodiments. Duplicate descriptions may be omitted or simplified, and the following description will primarily focus on differences therebetween.

Figure 10:
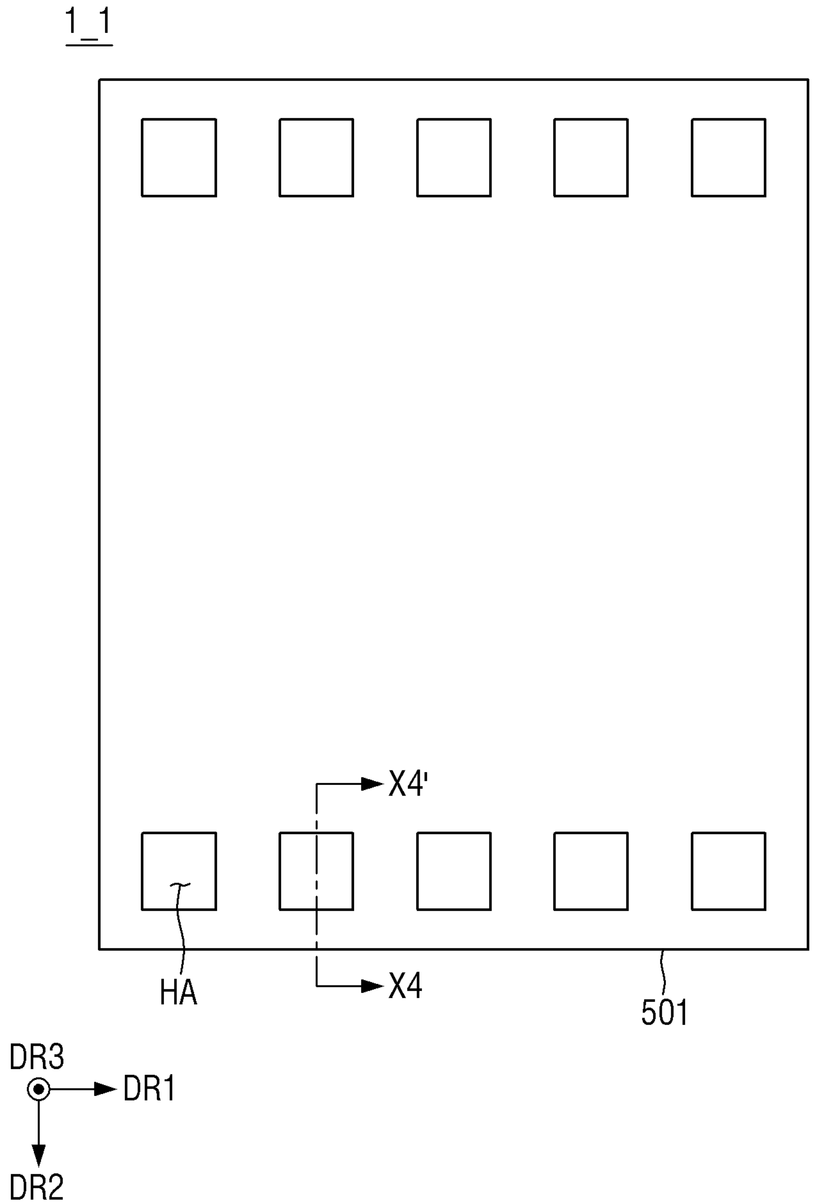
FIG. 10 is a plan view schematically showing a chassis member of a display device according to another embodiment.
Figure 11:
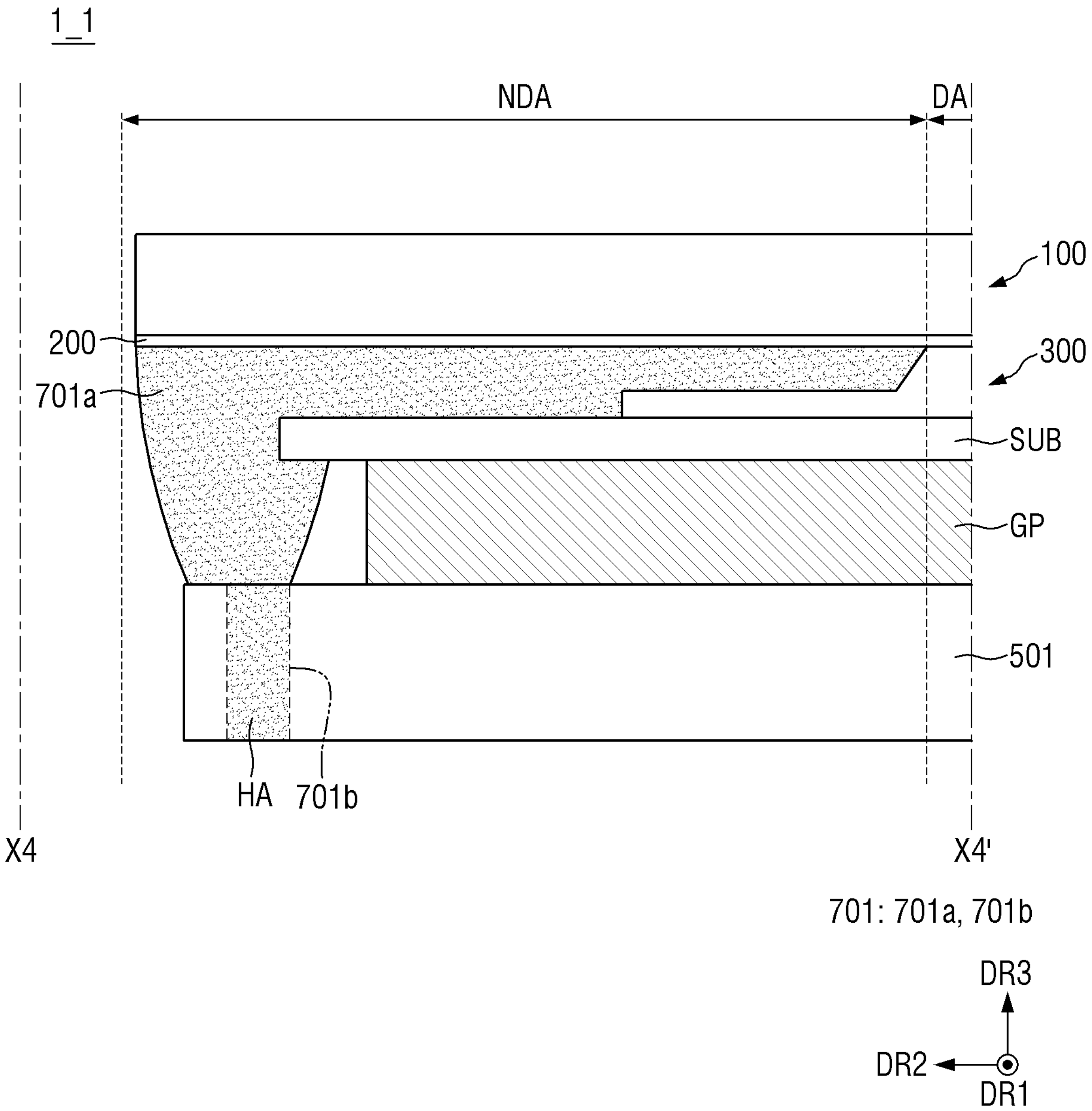
FIG. 11 schematically shows a cross section taken along the line X4-X4' of FIG. 10 in a state in which a sealing member is interposed between a chassis member and a film member in the display device shown in FIG. 10.

FIG. 10 is a plan view schematically showing a chassis member of a display device according to another embodiment, and FIG. 11 schematically shows a cross section taken along the line X4-X4' of FIG. 10 showing a state in which a sealing member is interposed between a chassis member and a film member in the display device shown in FIG. 10.

Referring to FIG. 10 and FIG. 11, a chassis member 501 of a display device 1_1 according to an embodiment has a plurality of holes (e.g., openings) HA extending through the chassis member 501. The sealing member is received in and extends through (or fills) the plurality of holes HA. In some embodiments, a shape of each of the plurality of holes HA in a plan view may be rectangular. However, the present disclosure is not limited thereto. For example, t each of the plurality of holes HA may have a circular shape in a plan view.

The sealing member 701 according to this embodiment may have a main portion 701*a* received in the space between the film member 100 and the chassis member 501 and a through-portion 701*b* received in (or filling) the hole HA in the chassis member 501. The through-portion 701*b* may be coupled to the chassis member 501 at the hole HA so that a bonding force between the sealing member 701 and the chassis member 501 may be improved.

In the configuration as described above, the bonding between the sealing member 701 and the chassis member 501 in the non-display area NDA may be improved, such that the mechanical stability between the film member 100 and the chassis member 501 may be further improved.

Figure 12:
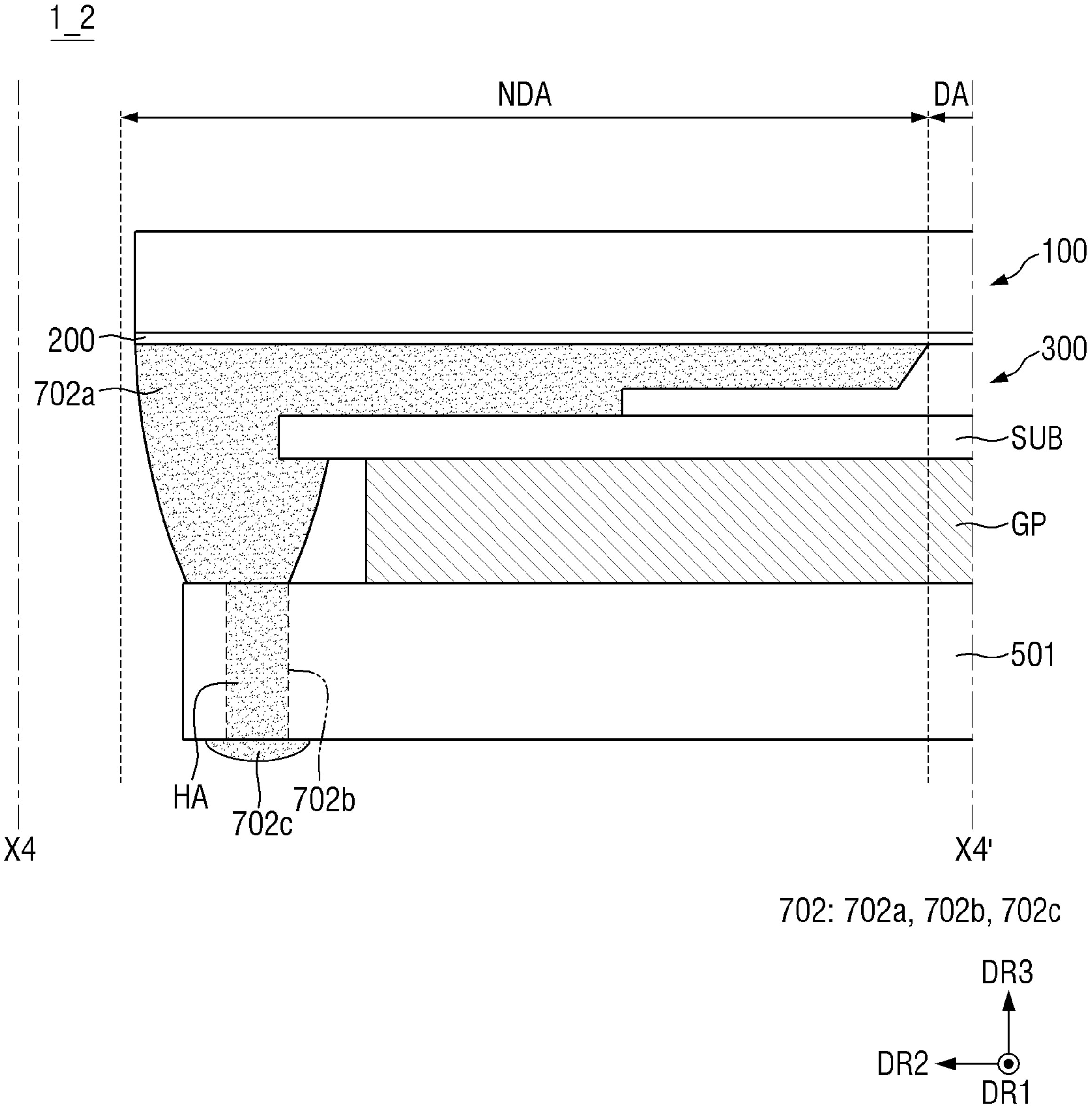
FIG. 12 is a view schematically showing a state in which a sealing member is interposed between a chassis member and a film member in a display device according to another embodiment.

FIG. 12 is a view schematically showing a state in which a sealing member is interposed between a chassis member and a film member in a display device according to another embodiment.

Referring to FIG. 12, a display device 1_2 according to this embodiment is different from the display device 1_1 as shown in FIG. 11 in that a sealing member 702 extends through the hole HA and then covers (or extends onto) a portion of a bottom face of the chassis member 501.

The sealing member 702 according to this embodiment may include a main portion 702*a* received in the space between the film member 100 and the chassis member 501, a through-portion 702*b* received in the hole HA in the chassis member 501, and a fixing portion 702*c* disposed on the bottom face of the chassis member 501. A dimension of the fixing portion 702*c* in the second direction DR2 may be greater than a dimension of the through-portion 702*b* and of the hole HA in the second direction DR2.

In the configuration as described above, the bonding between the sealing member 702 and the chassis member 501 in the non-display area NDA may be improved, such that the mechanical stability between the film member 100 and the chassis member 501 may be further improved.

Figure 13:
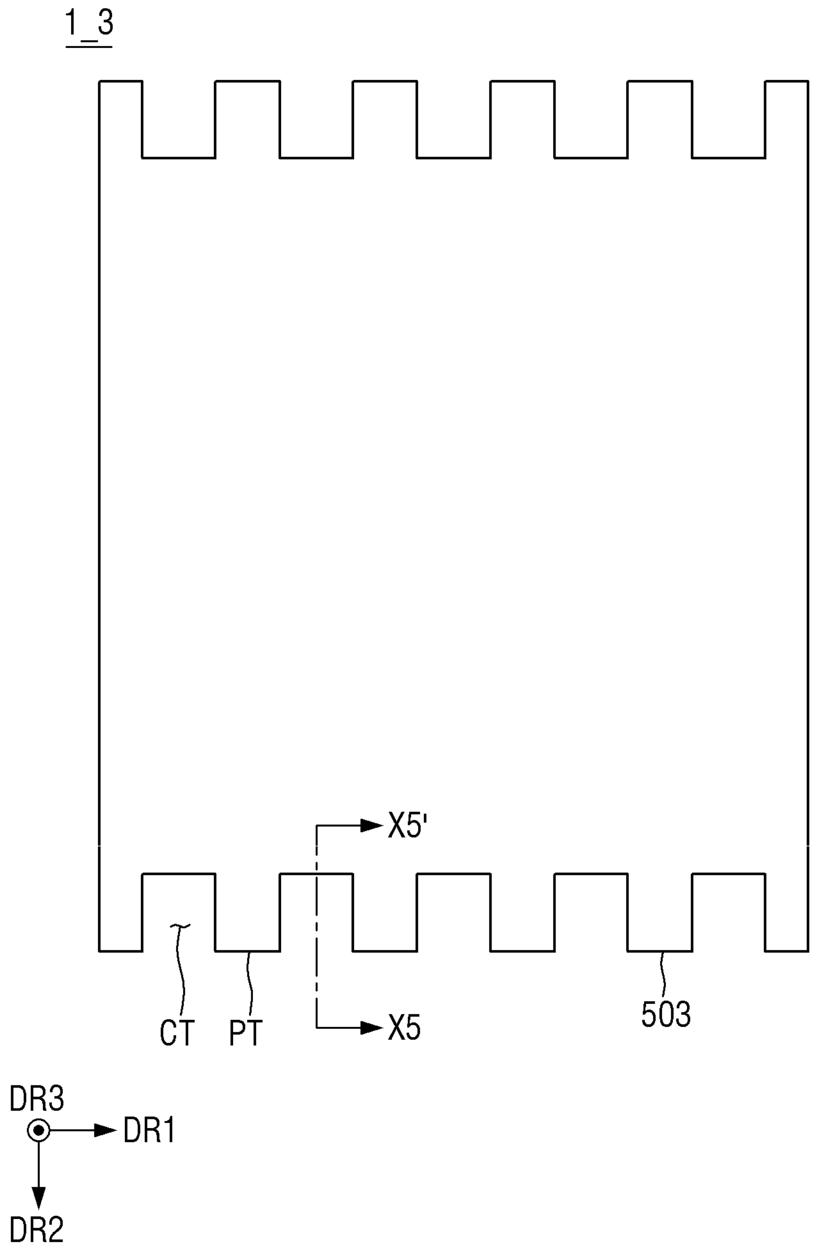
FIG. 13 is a plan view schematically showing a chassis member of a display device according to another embodiment.
Figure 14:
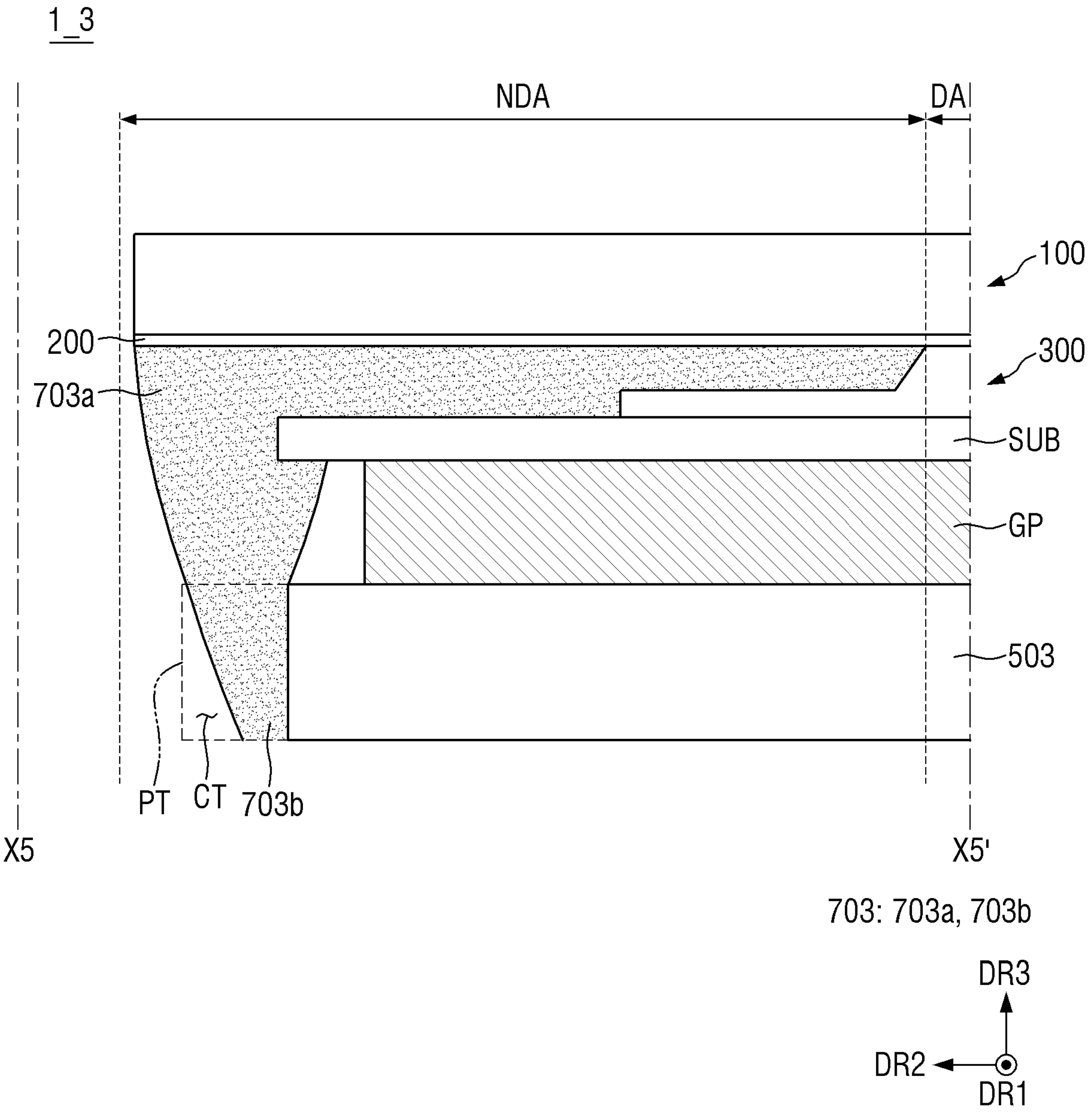
FIG. 14 schematically shows a cross-section taken along the line X5-X5' of FIG. 13 in a state in which a sealing member is interposed between a chassis member and a film member in the display device shown in FIG. 13.

FIG. 13 is a plan view schematically showing a chassis member of a display device according to another embodiment, and FIG. 14 schematically shows a cross-section taken along the line X5-X5' of FIG. 13 showing a state in which a sealing member is interposed between a chassis member and a film member in the display device shown in FIG. 13.

Referring to FIG. 13 and FIG. 14, a chassis member 503 of a display device 1_3 according to this embodiment has a varying dimension in the second direction DR2. For example, the chassis member 503 according to this embodiment may have a structure in which a plurality of grooves CT recessed in the second direction DR2 and a plurality of protrusions PT protruding in the second direction DR2 are alternately arranged with each other.

The sealing member 703 according to this embodiment may directly contact a top face of the protrusion PT the chassis member 503 and may directly contact a side face of the groove CT of the chassis member 503 in the second direction DR2. For example, the sealing member 703 may have a main portion 703*a* in direct contact with a top face of the chassis member 503 and a fastening portion 703*b* received in the groove CT to directly contact the side face of the chassis member 503 in the second direction DR2. The protrusions PT may be disposed on both opposite sides of the groove CT in the first direction DR1. The fastening portion 703*b* of the sealing member 703 may be partially surrounded by and coupled to the protrusions PT.

In the configuration as described above, the bonding between the sealing member 703 and the chassis member 503 in the non-display area NDA is improved, such that the mechanical stability between the film member 100 and the chassis member 503 may be further improved.

Figure 15:
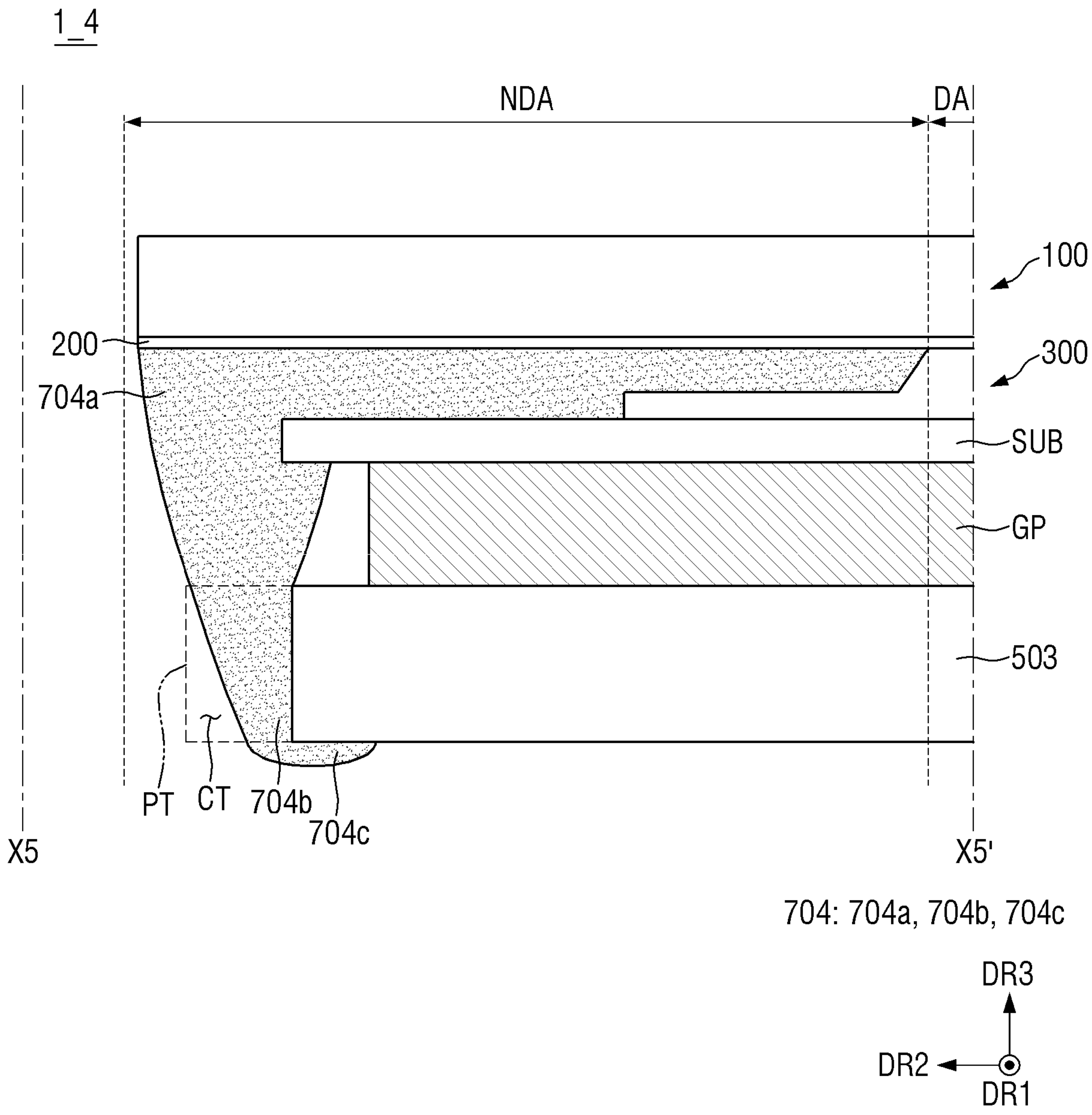
FIG. 15 is a view schematically showing a state in which a sealing member is interposed between a chassis member and a film member in a display device according to another embodiment.

FIG. 15 is a view schematically showing a state in which a sealing member is interposed between a chassis member and a film member in a display device according to still yet another embodiment.

Referring to FIG. 15, a display device 1_4 according to this embodiment is different from the display device 1_3 shown in FIG. 14 in that the sealing member 704 extends beyond the groove CT and then covers a portion of the bottom face of the chassis member 503.

The sealing member 704 according to this embodiment may have a main portion 704*a* in direct contact with the top face of the chassis member 503, a fastening portion 704*b* received in the groove CT and in direct contact with the side face of the chassis member 503 in the second direction DR2, and a fixing portion 704*c* extending beyond the groove CT and disposed on a portion of the bottom face of the chassis member 503.

In the configuration as described above, the bonding between the sealing member 704 and the chassis member 503 in the non-display area NDA is improved, such that the mechanical stability between the film member 100 and the chassis member 503 may be further improved.

Figure 16:
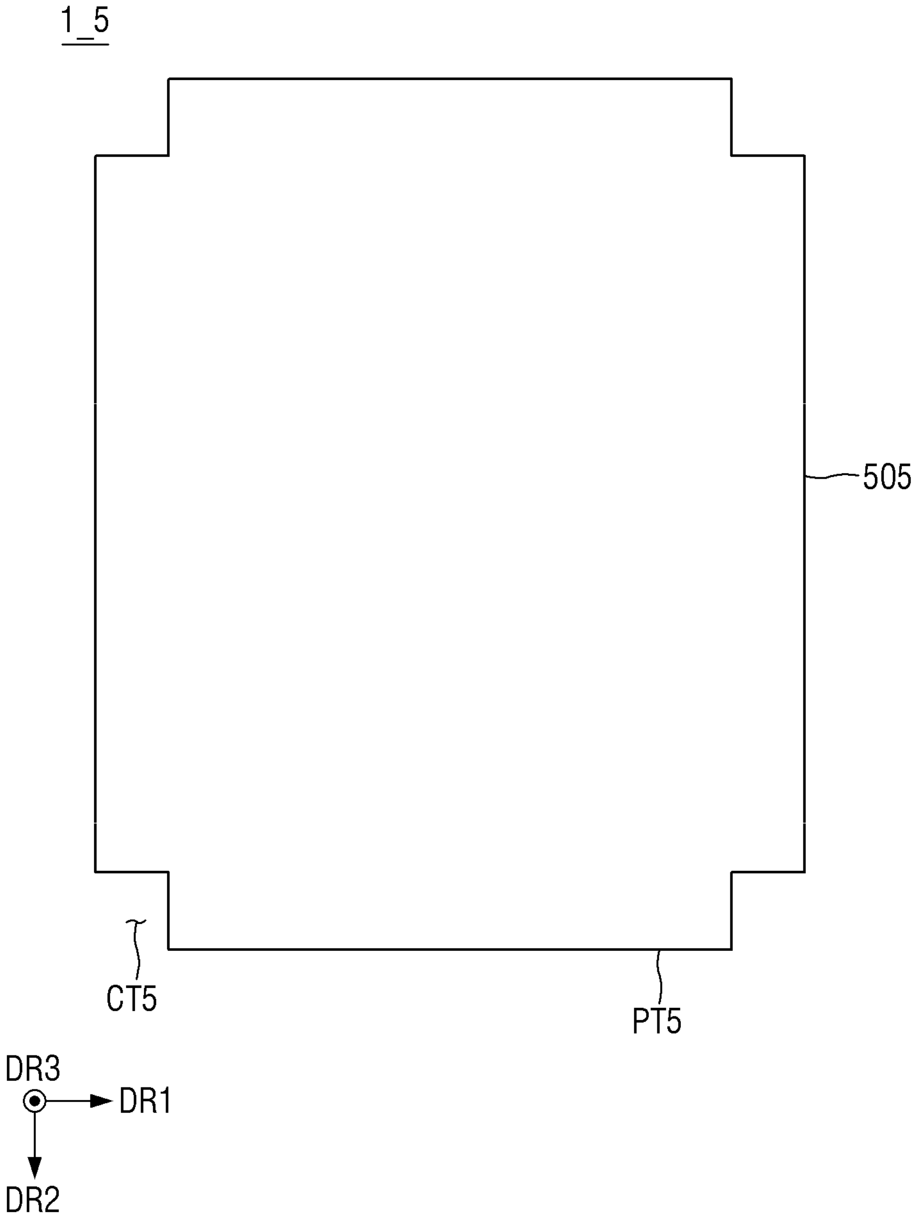
FIG. 16 is a plan view schematically showing a chassis member of a display device according to another embodiment.

FIG. 16 is a plan view schematically showing a chassis member of a display device according to another embodiment.

Referring to FIG. 16, a chassis member 505 of a display device 1_5 according to this embodiment has a groove CT5 defined at each corner of the chassis member 505 and a protrusion PT5 formed between adjacent grooves CT5.

In concluding the detailed description, those skilled in the art will appreciate that many variations and modifications can be made to the embodiments described herein without substantially departing from the present disclosure. Therefore, the disclosed embodiments of the present disclosure are to be understood in a generic and descriptive sense and not for purposes of limitation.

What is claimed is:

1. A display device comprising:

a display panel comprising a light-emitting element on a top face of a substrate and an overcoat layer on and extending over the light-emitting element with respect to the substrate;

a film member on the overcoat layer of the display panel;

a conductive layer between the overcoat layer and the film member;

a chassis member on a bottom face of the substrate of the display panel, a width of the chassis member being greater than a width of the substrate; and a sealing member covering a side face of the display panel, the sealing member electrically connecting the conductive layer and the chassis member to each other.

2. The display device of claim 1, wherein the sealing member comprises a conductive material, and wherein the chassis member comprises a conductive metal material.

3. The display device of claim 2, wherein a width of the film member is greater than each of the width of the substrate and the width of the chassis member.

4. The display device of claim 3, wherein the chassis member and the film member are spaced apart from each other with the display panel therebetween, and wherein the sealing member is between the film member and the chassis member.

5. The display device of claim 4, wherein a bottom face of the conductive layer is in direct contact with the sealing member, and wherein a top face of the chassis member is in direct contact with the sealing member.

6. The display device of claim 5, further comprising an adhesive layer between the conductive layer and the overcoat layer bonding the conductive layer and the overcoat layer to each other, wherein the adhesive layer exposes a portion of the conductive layer, and wherein the sealing member is in direct contact with the exposed portion of the conductive layer.

7. The display device of claim 6, wherein the conductive layer covers an entirety of a bottom face of the film member and comprises a transparent metal oxide.

8. The display device of claim 6, further comprising:

a wavelength conversion layer between the overcoat layer and the light-emitting element; and a color filter layer between the wavelength conversion layer and the overcoat layer.

9. The display device of claim 3, further comprising a heat dissipation portion between the chassis member and the substrate.

10. The display device of claim 9, wherein the heat dissipation portion comprises graphite.

11. The display device of claim 3, wherein the film member comprises a base film and an anti-fingerprint film on the base film.

12. The display device of claim 11, wherein the base film includes cellulose triacetate.

13. A display device having a display area and a non-display area extending around a periphery of the display area, the display device comprising:

a display panel comprising a substrate and a light-emitting element on the substrate, the light-emitting element defining the display area and configured to emit light;

a film member on a top face of the display panel and having a width greater than a width of the display panel;

a conductive layer between the display panel and the film member and having a larger width than the width of the display panel;

a chassis member on a bottom face of the display panel, a width of the chassis member being larger than the width of the substrate and smaller than the width of the film member; and a sealing member covering a side face of the display panel, wherein the chassis member and the film member are spaced apart from each other in the non-display area, and wherein the sealing member is between the chassis member and the film member and directly contacts a top face of the chassis member.

14. The display device of claim 13, wherein the chassis member comprises a conductive metal, wherein the sealing member comprises a conductive material, and wherein the sealing member is in direct contact with a bottom face of the conductive layer.

15. The display device of claim 14, further comprising a heat dissipation portion, wherein the heat dissipation portion is between the chassis member and the substrate.

16. The display device of claim 15, further comprising a plurality of flexible printed circuit boards on the substrate of the display panel, wherein one side of each of the plurality of flexible printed circuit boards is on a top face of the substrate, and wherein another side of each of the plurality of flexible printed circuit boards is on a bottom face of the chassis member.

17. The display device of claim 16, wherein a resin is between each of the flexible printed circuit boards and the substrate.

18. The display device of claim 14, wherein the chassis member has an opening extending through the chassis member, and wherein the sealing member is in and extends through the opening in the chassis member.

19. The display device of claim 18, wherein the sealing member extends through the opening and covers a portion of a bottom face of the chassis member.

20. The display device of claim 14, wherein the chassis member has a plurality of grooves and a plurality of protrusions protruding outwardly, wherein the grooves and the protrusions are alternately arranged with each other, and wherein the sealing member is in each of the plurality of grooves and is coupled to a side face of each groove of the chassis member.

* * * * *